(12) United States Patent
Eryurek et al.

(10) Patent No.: US 7,562,135 B2
(45) Date of Patent: Jul. 14, 2009

(54) ENHANCED FIELDBUS DEVICE ALERTS IN A PROCESS CONTROL SYSTEM

(75) Inventors: Evren Eryurek, Minneapolis, MN (US); Ram Ramachandran, Austin, TX (US); Cindy Alsup Scott, Georgetown, TX (US); Trevor Duncan Schleiss, Austin, TX (US)

(73) Assignee: Fisher-Rosemount Systems, Inc., Austin, TX (US)

( * ) Notice: Subject to any disclaimer, the term of this patent is extended or adjusted under 35 U.S.C. 154(b) by 233 days.

(21) Appl. No.: 09/861,790

(22) Filed: May 21, 2001

(65) Prior Publication Data

US 2002/0022894 A1 Feb. 21, 2002

Related U.S. Application Data

(60) Provisional application No. 60/273,164, filed on Mar. 1, 2001.

(30) Foreign Application Priority Data

| May 23, 2000 | (JP) | ................................ 2000-151327 |
| Jun. 19, 2000 | (JP) | ................................ 2000-182707 |
| Sep. 29, 2000 | (JP) | ................................ 2000-298990 |

(51) Int. Cl.
*G06F 15/173* (2006.01)
(52) U.S. Cl. .......................... 709/224; 709/223; 700/1; 700/17; 700/19; 700/21; 700/80
(58) Field of Classification Search ................ 709/224, 709/220, 221, 226; 700/1, 17, 19, 83; 340/3.1, 340/3.43, 853.2, 573.1
See application file for complete search history.

(56) References Cited

U.S. PATENT DOCUMENTS

| 3,096,434 A | 7/1963 | King ............................ 235/151 |
| 3,404,264 A | 10/1968 | Kugler ......................... 235/194 |
| 3,701,280 A | 10/1972 | Stroman ........................ 73/194 |
| 3,705,516 A | 12/1972 | Reis |

(Continued)

FOREIGN PATENT DOCUMENTS

CN 1007757 4/1990

(Continued)

OTHER PUBLICATIONS

International Preliminary Examination Report for PCT/US02/16033, mailed Sep. 16, 2003.

(Continued)

*Primary Examiner*—Yves Dalencourt
(74) *Attorney, Agent, or Firm*—Marshall, Gerstein & Borun LLP

(57) ABSTRACT

Enhanced Fieldbus device alerts enable Fieldbus devices within a process control system to report alarm or alert conditions that are detected within the devices to a system user or operator using a plurality of independently reportable device alarm parameters, each of which corresponds to a different level of severity and each of which may require a different type of response by the system user or operator. The independently reportable device alarm parameters include a parameter associated with a failure of a Fieldbus device, a parameter associated with maintenance needed by a Fieldbus device and an advisable action in connection with a Fieldbus device.

26 Claims, 6 Drawing Sheets

U.S. PATENT DOCUMENTS

| | | | |
|---|---|---|---|
| 3,981,836 A | 9/1976 | Pangle, Jr. et al. | 524/549 |
| RE29,383 E | 9/1977 | Gallatin et al. | 137/14 |
| 4,058,275 A | 11/1977 | Banks et al. | 244/3.15 |
| 4,099,413 A | 7/1978 | Ohte et al. | 374/175 |
| 4,322,976 A | 4/1982 | Sisson et al. | |
| 4,337,516 A | 6/1982 | Murphy et al. | 364/551 |
| 4,408,285 A | 10/1983 | Sisson et al. | |
| 4,425,798 A | 1/1984 | Nagai et al. | |
| 4,435,770 A | 3/1984 | Shiohata et al. | |
| 4,493,042 A | 1/1985 | Shima et al. | |
| 4,517,468 A | 5/1985 | Kemper | 290/52 |
| 4,527,271 A | 7/1985 | Hallee et al. | |
| 4,530,234 A | 7/1985 | Cullick et al. | 73/53 |
| 4,607,325 A | 8/1986 | Horn | |
| 4,635,214 A | 1/1987 | Kasai et al. | 364/551 |
| 4,642,782 A | 2/1987 | Kemper et al. | 364/550 |
| 4,644,478 A | 2/1987 | Stephens et al. | |
| 4,644,749 A | 2/1987 | Somes | 60/459 |
| 4,649,515 A | 3/1987 | Thompson et al. | 364/900 |
| 4,657,179 A | 4/1987 | Aggers et al. | |
| 4,683,542 A | 7/1987 | Tanguti | |
| 4,707,796 A | 11/1987 | Calabro et al. | 364/552 |
| 4,734,873 A | 3/1988 | Malloy et al. | |
| 4,758,964 A | 7/1988 | Bittner et al. | 364/508 |
| 4,763,243 A | 8/1988 | Barlow et al. | |
| 4,764,862 A | 8/1988 | Barlow et al. | |
| 4,777,585 A | 10/1988 | Kokawa et al. | 364/164 |
| 4,819,233 A | 4/1989 | Delucia et al. | 371/19 |
| 4,831,564 A | 5/1989 | Suga | 364/999.999 |
| 4,843,557 A | 6/1989 | Ina et al. | 364/999.999 |
| 4,873,655 A | 10/1989 | Kondraska | 364/553 |
| 4,885,694 A | 12/1989 | Pray et al. | |
| 4,885,707 A | 12/1989 | Nichol et al. | |
| 4,907,167 A | 3/1990 | Skeirik | |
| 4,910,691 A | 3/1990 | Skeirik | |
| 4,924,418 A | 5/1990 | Backman et al. | 364/550 |
| 4,934,196 A | 6/1990 | Romano | 73/999.999 |
| 4,944,035 A | 7/1990 | Aagardl et al. | |
| 4,956,793 A | 9/1990 | Bonne et al. | |
| 4,964,125 A | 10/1990 | Kim | 371/20 |
| 4,965,742 A | 10/1990 | Skeirik | |
| 4,980,844 A | 12/1990 | Demjanenko et al. | |
| 4,992,965 A | 2/1991 | Holter et al. | 364/999.999 |
| 5,005,142 A | 4/1991 | Lipchak et al. | 354/550 |
| 5,006,992 A | 4/1991 | Skeirik | |
| 5,008,810 A | 4/1991 | Kessel et al. | |
| 5,015,934 A | 5/1991 | Holley et al. | |
| 5,018,215 A | 5/1991 | Nasr et al. | |
| 5,043,862 A | 8/1991 | Takahashi et al. | 364/162 |
| 5,043,863 A | 8/1991 | Bristol et al. | |
| 5,050,095 A | 9/1991 | Samad | |
| 5,053,815 A | 10/1991 | Wendell | 355/208 |
| 5,070,458 A | 12/1991 | Gilmore et al. | |
| 5,081,598 A | 1/1992 | Bellows et al. | 364/513 |
| 5,089,984 A | 2/1992 | Struger et al. | 364/200 |
| 5,094,107 A | 3/1992 | Schoch | |
| 5,098,197 A | 3/1992 | Shepard et al. | 374/120 |
| 5,099,436 A | 3/1992 | McCown et al. | 364/550 |
| 5,103,409 A | 4/1992 | Shimizu et al. | 364/556 |
| 5,111,531 A | 5/1992 | Grayson et al. | 364/513 |
| 5,121,467 A | 6/1992 | Skeirik | |
| 5,122,976 A | 6/1992 | Bellows et al. | 364/550 |
| 5,130,936 A | 7/1992 | Sheppard et al. | 364/999.999 |
| 5,134,574 A | 7/1992 | Beaverstock et al. | |
| 5,140,530 A | 8/1992 | Guha et al. | |
| 5,142,612 A | 8/1992 | Skeirik | |
| 5,148,378 A | 9/1992 | Shibayama et al. | 364/999.999 |
| 5,161,013 A | 11/1992 | Rylander et al. | |
| 5,167,009 A | 11/1992 | Skeirik | |
| 5,175,678 A | 12/1992 | Frerichs et al. | 364/148 |
| 5,187,674 A | 2/1993 | Bonne | |
| 5,193,143 A | 3/1993 | Kaemmerer et al. | |
| 5,197,114 A | 3/1993 | Skeirik | |
| 5,197,328 A | 3/1993 | Fitzgerald | 73/168 |
| 5,200,028 A | 4/1993 | Tatsumi | 156/656 |
| 5,200,958 A | 4/1993 | Hamilton et al. | 371/16.4 |
| 5,210,704 A | 5/1993 | Husseiny | |
| 5,212,765 A | 5/1993 | Skeirik | |
| 5,214,582 A | 5/1993 | Gray | 364/999.999 |
| 5,224,203 A | 6/1993 | Skeirik | |
| 5,228,780 A | 7/1993 | Shepard et al. | 374/175 |
| 5,235,527 A | 8/1993 | Ogawa et al. | 364/999.999 |
| 5,251,151 A | 10/1993 | Demjanenko et al. | |
| 5,265,031 A | 11/1993 | Malczewski | 364/497 |
| 5,265,222 A | 11/1993 | Nishiya et al. | 395/3 |
| 5,274,572 A | 12/1993 | O'Neill et al. | 364/550 |
| 5,282,131 A | 1/1994 | Rudd et al. | 364/164 |
| 5,282,261 A | 1/1994 | Skeirik | |
| 5,291,190 A | 3/1994 | Scarola et al. | |
| 5,293,585 A | 3/1994 | Morita | 395/52 |
| 5,301,101 A | 4/1994 | MacArthur et al. | |
| 5,303,181 A | 4/1994 | Stockton | 365/96 |
| 5,305,230 A | 4/1994 | Matsumoto et al. | 364/495 |
| 5,311,421 A | 5/1994 | Nomura et al. | 364/157 |
| 5,311,447 A | 5/1994 | Bonne | |
| 5,311,562 A | 5/1994 | Palusamy | |
| 5,315,521 A | 5/1994 | Hanson et al. | 364/468 |
| 5,317,520 A | 5/1994 | Castle | 364/482 |
| 5,325,522 A | 6/1994 | Vaughn | |
| 5,327,357 A | 7/1994 | Feinstein et al. | 364/502 |
| 5,333,240 A | 7/1994 | Matsumoto et al. | 395/23 |
| 5,333,298 A | 7/1994 | Bland et al. | |
| 5,347,449 A | 9/1994 | Meyer et al. | 364/185 |
| 5,349,541 A | 9/1994 | Alexandro, Jr. et al. | 364/578 |
| 5,351,184 A | 9/1994 | Lu et al. | |
| 5,353,207 A | 10/1994 | Keeler et al. | |
| 5,353,315 A | 10/1994 | Scarola et al. | |
| 5,361,612 A | 11/1994 | Voiculescu et al. | 70/241 |
| 5,369,599 A | 11/1994 | Sadjadi et al. | |
| 5,373,452 A | 12/1994 | Guha | |
| 5,384,698 A | 1/1995 | Jelinek | |
| 5,384,699 A | 1/1995 | Levy et al. | 364/999.999 |
| 5,386,373 A | 1/1995 | Keeler et al. | 364/577 |
| 5,390,287 A | 2/1995 | Obata | 395/67 |
| 5,390,326 A | 2/1995 | Shah | |
| 5,394,341 A | 2/1995 | Kepner | 364/999.999 |
| 5,394,543 A | 2/1995 | Hill et al. | 395/575 |
| 5,396,415 A | 3/1995 | Konar et al. | |
| 5,398,303 A | 3/1995 | Tanaka | |
| 5,400,246 A * | 3/1995 | Wilson et al. | 700/17 |
| 5,404,064 A | 4/1995 | Mermelstein et al. | 310/319 |
| 5,408,406 A | 4/1995 | Mathur et al. | |
| 5,408,586 A | 4/1995 | Skeirik | 395/23 |
| 5,414,645 A | 5/1995 | Hirano | 364/999.999 |
| 5,416,468 A * | 5/1995 | Baumann | 340/573.1 |
| 5,419,197 A | 5/1995 | Ogi et al. | 73/659 |
| 5,430,642 A | 7/1995 | Nakajima et al. | 364/148 |
| 5,440,478 A | 8/1995 | Fisher et al. | 364/188 |
| 5,442,544 A | 8/1995 | Jelinek | |
| 5,461,570 A | 10/1995 | Wang et al. | 364/468 |
| 5,467,355 A | 11/1995 | Umeda et al. | 371/29.1 |
| 5,469,735 A | 11/1995 | Watanabe | 73/118.1 |
| 5,483,387 A | 1/1996 | Bauhahn et al. | 359/885 |
| 5,485,753 A | 1/1996 | Burns et al. | 73/720 |
| 5,486,920 A | 1/1996 | Killpatrick et al. | |
| 5,486,996 A | 1/1996 | Samad et al. | |
| 5,488,697 A | 1/1996 | Kaemmerer et al. | |
| 5,489,831 A | 2/1996 | Harris | 318/701 |
| 5,499,188 A | 3/1996 | Kline, Jr. et al. | |
| 5,500,941 A | 3/1996 | Gil | 395/183.14 |
| 5,511,004 A | 4/1996 | Dubost et al. | 364/999.999 |
| 5,511,422 A | 4/1996 | Hernandez | |
| 5,521,814 A | 5/1996 | Teran et al. | |
| 5,533,413 A | 7/1996 | Kobayashi et al. | |

| | | | | | | |
|---|---|---|---|---|---|---|
| 5,537,310 A | 7/1996 | Tanake et al. | | 5,907,701 A | 5/1999 | Hanson |
| 5,541,833 A | 7/1996 | Bristol et al. | | 5,909,370 A | 6/1999 | Lynch |
| 5,546,301 A | 8/1996 | Agrawal et al. | | 5,909,541 A | 6/1999 | Sampson et al. |
| 5,548,528 A | 8/1996 | Keeler et al. ............... 364/497 | | 5,909,586 A | 6/1999 | Anderson |
| 5,559,690 A | 9/1996 | Keeler et al. | | 5,917,840 A | 6/1999 | Cheney et al. |
| 5,561,599 A | 10/1996 | Lu | | 5,918,233 A | 6/1999 | La Chance et al. |
| 5,566,065 A | 10/1996 | Hansen et al. | | 5,922,963 A | 7/1999 | Piety et al. |
| 5,570,282 A | 10/1996 | Hansen et al. | | 5,924,086 A | 7/1999 | Mathur et al. |
| 5,570,300 A | 10/1996 | Henry et al. .......... 364/999.999 | | 5,940,290 A | 8/1999 | Dixon |
| 5,572,420 A | 11/1996 | Lu | | 5,948,101 A | 9/1999 | David et al. |
| 5,574,638 A | 11/1996 | Lu | | 5,949,417 A | 9/1999 | Calder |
| 5,586,066 A | 12/1996 | White et al. ................ 364/576 | | 5,951,654 A | 9/1999 | Avsan .......................... 710/5 |
| 5,596,704 A | 1/1997 | Geddes et al. | | 5,960,214 A | 9/1999 | Sharpe, Jr. et al. |
| 5,598,521 A | 1/1997 | Kilgore et al. .............. 395/155 | | 5,960,441 A | 9/1999 | Bland et al. |
| 5,600,148 A | 2/1997 | Cole et al. ................ 250/495.1 | | 5,975,737 A | 11/1999 | Crater et al. |
| 5,602,757 A | 2/1997 | Haseley et al. | | 5,984,502 A | 11/1999 | Calder |
| 5,602,761 A | 2/1997 | Spoerre et al. | | 5,988,847 A | 11/1999 | McLaughlin et al. |
| 5,604,914 A | 2/1997 | Kabe .......................... 395/800 | | 5,995,916 A | 11/1999 | Nixon et al. |
| 5,610,339 A | 3/1997 | Haseley et al. | | 5,997,167 A | 12/1999 | Crater et al. |
| 5,625,574 A | 4/1997 | Griffiths et al. ............. 364/550 | | 6,006,171 A | 12/1999 | Vines ......................... 702/184 |
| 5,628,994 A | 5/1997 | Kaper et al. ................ 424/93.2 | | 6,008,985 A | 12/1999 | Lake et al. |
| 5,631,825 A | 5/1997 | van Weele et al. | | 6,014,612 A | 1/2000 | Larson ........................ 702/183 |
| 5,640,491 A | 6/1997 | Bhat et al. | | 6,017,143 A | 1/2000 | Eryurek et al. |
| 5,640,493 A | 6/1997 | Skeirik | | 6,026,352 A | 2/2000 | Burns et al. |
| 5,646,350 A | 7/1997 | Robinson et al. | | 6,033,257 A | 3/2000 | Lake et al. |
| 5,666,297 A | 9/1997 | Britt et al. | | 6,035,339 A | 3/2000 | Agraharam ................. 709/234 |
| 5,671,335 A | 9/1997 | Davis et al. .................... 395/23 | | 6,038,486 A | 3/2000 | Saitoh et al. |
| 5,671,351 A | 9/1997 | Wild et al. ............. 395/183.14 | | 6,041,263 A | 3/2000 | Boston et al. |
| 5,675,504 A | 10/1997 | Serodes et al. .............. 364/496 | | 6,047,221 A | 4/2000 | Piche et al. |
| 5,680,409 A | 10/1997 | Qin et al. | | 6,055,483 A | 4/2000 | Lu |
| 5,682,309 A | 10/1997 | Bartusiak et al. ............ 364/149 | | 6,061,603 A | 5/2000 | Papadopoulos et al. |
| 5,687,090 A | 11/1997 | Chen et al. | | 6,067,505 A | 5/2000 | Bonoyer et al. |
| 5,691,895 A | 11/1997 | Kurtzberg et al. | | 6,076,124 A | 6/2000 | Korowitz et al. |
| 5,692,158 A | 11/1997 | Degeneff et al. | | 6,078,843 A | 6/2000 | Shavit |
| 5,698,788 A | 12/1997 | Mol et al. | | 6,093,211 A | 7/2000 | Hamielec et al. |
| 5,704,011 A | 12/1997 | Hansen et al. | | 6,106,785 A | 8/2000 | Havlena et al. |
| 5,715,158 A | 2/1998 | Chen | | 6,108,616 A | 8/2000 | Borchers et al. |
| 5,729,661 A | 3/1998 | Keeler et al. | | 6,110,214 A | 8/2000 | Klimasaukas |
| 5,740,324 A | 4/1998 | Mathur et al. | | 6,122,555 A | 9/2000 | Lu |
| 5,742,513 A | 4/1998 | Bouhenguel et al. | | 6,128,279 A | 10/2000 | O'Neil et al. |
| 5,754,451 A | 5/1998 | Williams | | 6,134,574 A | 10/2000 | Oberman et al. ............. 708/551 |
| 5,757,371 A | 5/1998 | Oran .......................... 345/348 | | 6,144,952 A | 11/2000 | Keeler et al. |
| 5,761,518 A | 6/1998 | Boehling et al. | | 6,169,980 B1 | 1/2001 | Keeler et al. |
| 5,764,891 A | 6/1998 | Warrior | | 6,185,470 B1 | 2/2001 | Pado et al. .................... 700/104 |
| 5,768,119 A | 6/1998 | Havekost et al. | | 6,197,480 B1 | 3/2001 | Iguchi et al. |
| 5,777,872 A | 7/1998 | He | | 6,246,972 B1 | 6/2001 | Klimasaukas ................. 703/2 |
| 5,781,432 A | 7/1998 | Keeler et al. | | 6,259,959 B1 | 7/2001 | Martin ........................ 700/99 |
| 5,781,878 A | 7/1998 | Mizoguchi et al. .......... 701/109 | | 6,266,726 B1 | 7/2001 | Nixon et al. |
| 5,790,898 A | 8/1998 | Kishima et al. | | 6,298,377 B1 * | 10/2001 | Hartikainen et al. ........ 709/223 |
| 5,796,602 A * | 8/1998 | Wellan et al. .................... 700/1 | | 6,298,454 B1 | 10/2001 | Schleiss et al. |
| 5,796,609 A | 8/1998 | Tao et al. | | 6,317,638 B1 | 11/2001 | Schreder et al. |
| 5,798,939 A | 8/1998 | Ochoa et al. | | 6,317,701 B1 | 11/2001 | Pyötsiä et al. |
| 5,805,442 A | 9/1998 | Crater et al. | | 6,332,110 B1 | 12/2001 | Wolfe |
| 5,809,490 A | 9/1998 | Guiver et al. | | 6,389,331 B1 | 5/2002 | Jensen ........................ 700/275 |
| 5,819,050 A | 10/1998 | Boehling et al. | | 6,397,114 B1 | 5/2002 | Eryurek et al. |
| 5,819,232 A | 10/1998 | Shipman | | 6,400,681 B1 | 6/2002 | Bertin ........................ 370/351 |
| 5,825,645 A | 10/1998 | Konar et al. | | 6,418,465 B1 | 7/2002 | Hirosawa .................... 709/206 |
| 5,826,249 A | 10/1998 | Skeirik | | 6,421,571 B1 | 7/2002 | Spriggs et al. |
| 5,838,561 A | 11/1998 | Owen .......................... 364/152 | | 6,445,963 B1 | 9/2002 | Blevins et al. |
| 5,842,189 A | 11/1998 | Keeler et al. | | 6,507,797 B1 | 1/2003 | Kliman et al. |
| 5,847,952 A | 12/1998 | Samad | | 6,529,780 B1 | 3/2003 | Soergel et al. |
| 5,848,365 A | 12/1998 | Coverdill ...................... 701/35 | | 6,535,769 B1 | 3/2003 | Konar et al. |
| 5,855,791 A | 1/1999 | Hays et al. | | 6,549,130 B1 | 4/2003 | Joao et al. |
| 5,859,773 A | 1/1999 | Keeler et al. | | 6,567,718 B1 | 5/2003 | Campbell .................... 700/30 |
| 5,859,964 A | 1/1999 | Wang et al. | | 6,571,273 B1 | 5/2003 | Shirai ........................ 709/201 |
| 5,875,420 A | 2/1999 | Piety et al. | | 6,591,260 B1 | 7/2003 | Schwarzhoff ................. 707/2 |
| 5,877,954 A | 3/1999 | Klimasauskas et al. | | 6,609,040 B1 | 8/2003 | Brunnemann |
| 5,892,679 A | 4/1999 | He | | 6,628,994 B1 | 9/2003 | Turicchi et al. |
| 5,892,939 A | 4/1999 | Call et al. | | 6,633,782 B1 | 10/2003 | Schleiss ........................ 700/26 |
| 5,898,869 A | 4/1999 | Anderson | | 6,651,012 B1 | 11/2003 | Bechhoefer et al. |
| 5,901,058 A | 5/1999 | Steinman et al. | | 6,654,697 B1 | 11/2003 | Eryurek et al. ............. 702/183 |
| 5,903,455 A | 5/1999 | Sharpe, Jr. et al. | | 6,690,274 B1 * | 2/2004 | Bristol ........................ 340/506 |
| 5,905,989 A | 5/1999 | Biggs | | 6,704,689 B1 | 3/2004 | Hogan ........................ 702/184 |

| | | | |
|---|---|---|---|
| 6,717,513 | B1 | 4/2004 | Sandelman et al. ......... 340/506 |
| 6,721,609 | B1 | 4/2004 | Wojsznis ..................... 700/28 |
| 6,732,191 | B1 | 5/2004 | Baker ............................. 710/1 |
| 6,738,388 | B1 | 5/2004 | Stevenson et al. |
| 6,758,168 | B2 | 7/2004 | Koskinen et al. ............ 122/7 R |
| 6,760,782 | B1 | 7/2004 | Swales ....................... 709/224 |
| 6,774,786 | B1 | 8/2004 | Havekost .................... 340/517 |
| 2002/0022894 | A1 | 2/2002 | Eryurek et al. |
| 2002/0067370 | A1 | 6/2002 | Forney et al. ............... 345/733 |
| 2002/0077711 | A1 | 6/2002 | Nixon et al. |
| 2002/0147511 | A1 | 10/2002 | Eryurek et al. |
| 2002/0161940 | A1 | 10/2002 | Eryurek et al. |
| 2002/0163427 | A1 | 11/2002 | Eryurek et al. |
| 2003/0002969 | A1 | 1/2003 | Risser ........................ 414/542 |
| 2003/0009572 | A1 | 1/2003 | Thurner ...................... 709/230 |
| 2003/0014500 | A1 | 1/2003 | Schleiss et al. |
| 2003/0028268 | A1 | 2/2003 | Eryurek et al. |
| 2003/0195934 | A1 | 10/2003 | Peterson et al. ............. 709/206 |
| 2004/0075689 | A1 | 4/2004 | Schleiss et al. ............... 700/83 |
| 2004/0181364 | A1 | 9/2004 | Reeves et al. |
| 2005/0007249 | A1 | 1/2005 | Eryurek et al. |
| 2005/0240289 | A1 | 10/2005 | Hoyte .......................... 700/49 |

FOREIGN PATENT DOCUMENTS

| | | |
|---|---|---|
| CN | 1097804 | 1/1995 |
| CN | 1267373 | 9/2000 |
| DE | 35 40204 C1 | 9/1986 |
| DE | 40 08 560 A1 | 9/1990 |
| DE | 44 33 593 A1 | 6/1995 |
| DE | 195 02 499 | 8/1996 |
| EP | 0 122 622 | 10/1984 |
| EP | 0 377 736 | 7/1990 |
| EP | 0 413 814 | 2/1991 |
| EP | 0 487 419 | 5/1992 |
| EP | 0 594 227 | 4/1994 |
| EP | 0 612 039 | 8/1994 |
| EP | 626 697 A1 | 11/1994 |
| EP | 0 644 470 | 3/1995 |
| EP | 0 362 386 | 6/1995 |
| EP | 0 827 096 | 3/1998 |
| EP | 0 624 847 | 8/1999 |
| EP | 0 964 325 A1 | 12/1999 |
| EP | 0 965 897 A1 | 12/1999 |
| EP | 961 184 A2 | 12/1999 |
| EP | 0959398 | 12/1999 |
| GB | 2083258 | 3/1982 |
| GB | 2 294 129 | 4/1996 |
| GB | 2 294 793 | 5/1996 |
| GB | 2 347 234 A | 8/2000 |
| GB | 23 47 234 A | 8/2000 |
| GB | 2 380 833 | 4/2003 |
| JP | 06242192 | 2/1994 |
| JP | 07234988 | 5/1995 |
| WO | WO 98/38585 | 9/1998 |
| WO | WO 99/13418 | 3/1999 |
| WO | WO 00/50851 | 8/2000 |
| WO | WO 02/23405 | 3/2002 |
| WO | WO 02/095633 | 11/2002 |
| WO | WO 03/075206 | 9/2003 |

OTHER PUBLICATIONS http://www.geindustrial.com/cwc/services?id=73 on Jul. 18, 2002.
"Components of GE Predictor™ Services," GE Industrial Systems, available at http://www.geindustrial.com/cwc/services?id=74 on Jul. 18, 2002.
"Customer Benefits," GE Industrial Systems, available at http://www.geindustrial.com/cwc/services?id=75 on Jul. 18, 2002.
U.S. Appl. No. 09/499,445, dated Feb. 7, 2000, "Diagnostics Expert in a Process Control System."
U.S. Appl. No. 09/707,580, dated Nov. 17, 2000, "Integrated Alarm Display in a Process Control Network."
U.S. Appl. No. 09/838,494, dated Apr. 19, 2001, "Enhanced Device Alarms in a Process Control System."
U.S. Appl. No. 09/257,896, dated Feb. 25, 1999.
U.S. Appl. No. 09/593,327, dated Jun. 14, 2000, "Integrated Optimal Model Predictive Control in a Process Control System."
"GE Predictor™ Services: GE Predictor Services Overview," GE Industrial Systems, available at http://www.geindustrial.com/cwc/services?id=71 on Jul. 18, 2002.
"Electrical Equipment Coverage," GE Industrial Systems, available at http://www.geindustrial.com/cwc/services?id=72 on Jul. 18, 2002.
"Customer Impact," GE Industrial Systems, available at.
"Status Signals of Field Instruments," NAMUR Recommendation, NA 64, Feb. 1, 2001, pp. 1-8.
International Search Report for PCT/US04/004939, issued Sep. 8, 2004.
Written Opinion for PCT/US04/004939, mailed Sep. 29, 2004.
Great Britain Examination Report under Section 18(3) issued Dec. 17, 2003 in Application No. GB 0126490.2.
International Preliminary Examination Report for PCT/US02/15901, mailed Sep. 10, 2003.
Great Britain Search Report under Section 17 performed on Feb. 11, 2002 in Application No. GB 0212610.0.
Great Britain Examination Report under Section 18(3) issued on Sep. 16, 2004 in Application No. GB 0212610.0.
Search Report under Section 17 issued by Great Britain Patent Office, dated Jun. 11, 2002 in Application No. GB 012490.2 (UK 2083258).
International Search Report for PCT/US02/06577, dated Nov. 13, 2002.
Wernwe Kalkhoff, "Agent-Oriented Robot Task Transformation," Proceeding of the International Symposium on Intelligent Control, IEEE, pp. 242-247 (Aug. 27, 1995).
dotnet.za.net, "Web Services—A Guide for Business and IT Managers (Sep. 23, 2001)", (Copyright 2001), www.dotnet.za.net.
European Examination Report, issued in EP 02717514.0, dated Jun. 29, 2004.
European Examination Report, issued in EP 02723319.6, dated Jul. 1, 2004.
Examination Report under Section 18(3) issued in GB 0308687.9 by the United Kingdom Patent Office on Mar. 11, 2005.
First Office Action issued in Chinese Application No. 02122060.3 on Feb. 4, 2005.
First Office Action issued in Chinese Application No. 02805785.6 on Nov. 11, 2005.
First Office Action issued in Chinese Application No. 02805854.2 on Nov. 11, 2005.
International Search Report issued in PCT/US02/15901, European Patent Office, mailed Jun. 17, 2003.
International Search Report of PCT/US02/05874, European Patent Office, mailed Nov. 13, 2002.
International Preliminary Examination Report issued in PCT/US02/05874, European Patent Office, dated Feb. 3, 2003.
Lighthammer Illuminator™ Manufacturing Intelligence Brochure "Now you can see all your manufacturing information from a single interface—in real-time, from anywhere."
Lighthammer Software Development, "Illuminator™ The 1st 'Plant Information Portal'™" (Copyright 1999).
Mazeda et al., "Supervision and Optimised Process Control in Sugar Beet Factories," Centre of Sugar Technology, Spain from www.univ-reims.fr/externes.avh10mazaeda.pdf.
Search Report under Section 17(5) issued in GB 0416908.2 application by the United Kingdom Patent Office on Oct. 13, 2004.
Search Report under Section 17) issued in GB 0308687.9 by the United Kingdom Patent Office on Aug. 29, 2003.
"Status Signals of Field Instruments," NAMUR Recommendation, NA 64, Feb. 1, 2001, pp. 1-8.
Systinet, "Introduction to Web Services", (Copyright 2001, 2002), www.systinet.com.
Web Services Architect, "What are Web Services", www.webservicearchitect.com.
Written Opinion issued in PCT/US02/15901, European Patent Office, mailed Jul. 16, 2003.
Written Opinion issued in PCT/US02/05874, European Patent Office, mailed Nov. 13, 2002.

U.S. Appl. No. 60/273,164, filed Mar. 1, 2001, "Asset Utilization Expert in a Process Controls Plant".

Zolera Systems, "A Brief Guide to Web Services Protocols" (Copyright 2001), www.zolera.com.

Translation of First Office Action in corresponding Chinese application No. 02813264.5.

Office Action dated Jun. 6, 2007 in corresponding Japanese application JP 2002-591920 with English translation, 5 pages.

English language abstract of JP 2001-022430, Jan. 26, 2001.

Written Opinion for PCT/US02/16033, mailed Jul. 21, 2003.

\* cited by examiner

ENHANCED FIELDBUS DEVICE ALERTS IN A PROCESS CONTROL SYSTEM

RELATED APPLICATIONS

This application claims the benefit of the filing date of U.S. Provisional Patent Application No. 60/273,164, entitled "Asset Utilization Expert in a Process Control Plant," filed on Mar. 1, 2001.

FIELD OF THE INVENTION

The present invention relates generally to process control systems and, more particularly, to the enhancement of Fieldbus device alerts or alarms in a process control system.

DESCRIPTION OF THE RELATED ART

Process control systems, like those used in chemical, petroleum or other processes, typically include one or more centralized process controllers communicatively coupled to at least one host or operator workstation and to one or more field devices via analog, digital or combined analog/digital buses. The field devices, which may be, for example valves, valve positioners, switches and transmitters (e.g., temperature, pressure and flow rate sensors), perform functions within the process such as opening or closing valves and measuring process parameters. The process controller receives signals indicative of process measurements made by the field devices and/or other information pertaining to the field devices, uses this information to implement a control routine and then generates control signals which are sent over the buses or other communication lines to the field devices to control the operation of the process. Information from the field devices and the controllers may be made available to one or more applications executed by the operator workstation to enable an operator to perform desired functions with respect to the process, such as viewing the current state of the process, modifying the operation of the process, etc.

The Delta V process control system sold by Fisher Rosemount Systems, Inc. uses function blocks located or installed in controllers or different field devices to perform control operations. The controllers and, in some cases, the field devices are capable of storing and executing one or more function blocks, each of which receives inputs from and/or provides outputs to other function blocks (either within the same device or within different devices), and performs some process control operation, such as measuring or detecting a process parameter, controlling a device or performing a control operation, such as implementing a proportional-derivative-integral (PID) control routine. The different function blocks within a process control system are configured to communicate with each other (e.g., within a single device or over a bus) to form one or more process control loops, the individual operations of which may be distributed throughout the process control system. Also, as is well known, in addition to function blocks, FOUNDATION Fieldbus (hereinafter Fieldbus) devices may each have one or more associated resource blocks and/or transducer blocks that represent various capabilities of that Fieldbus device. For example, a Fieldbus temperature transmitter having two temperature sensing elements may include two transducer blocks (i.e., one for each sensing element) and a function block that reads the outputs of the two sensing elements (via the transducer blocks) to produce an average temperature value.

Typically, the function, transducer and resource blocks or the devices in which these blocks are implemented are configured to detect errors, faults or problems that occur within the process control loops, the units, the devices, etc. and to send a signal, such as an alarm or alert message, to notify an operator at an operator workstation or other user interface that an undesirable condition exists within the process control system or a control loop of the process control system. Such alarms or alerts may indicate, for example, that a block is not communicating, that a block has received or generated an out of range input or output, that a block is undergoing a fault or other undesirable condition, etc. In current alarm processing and display systems, an application executed at, for example, an operator interface/workstation, may be configured to receive messages containing process alarms related to process operation and to display these process alarms in a coherent and manageable manner to thereby enable an operator to manage alarms in some organized or logical way. Such an operator interface system is described in U.S. Pat. No. 5,768,119, entitled "Process Control System Including Alarm Priority Adjustment," which is hereby incorporated by reference herein.

In the past, conventional field devices were used in process control systems to send and receive analog signals, such as, for example, 4-20 milliamp (mA) signals to and from the process controller via an analog bus or analog lines. However, these 4-20 mA signals are limited in nature because they are only indicative of process measurements made by the device or of process control signals generated by the controller required to control the operation of the device during runtime. As a result, conventional 4-20 mA devices are incapable of generating alarms or alerts pertaining to the operational capability or status of the devices. As a result, alarms associated with the condition or status of these devices have generally not been available within process control systems.

More recently, smart field devices including a microprocessor and a memory have become prevalent in the process control industry. A number of open smart device communication protocols such as the Fieldbus, HART®, PROFIBUS®, WORLDFIP®, Device-Net®, and CAN protocols have been developed to enable smart field devices made by different manufacturers to be used together within the same process control network. In addition to performing a primary function within the process, a smart field device may store data pertaining to the device, communicate with the controller and/or other devices in a digital or combined digital and analog format and may perform secondary tasks such as self-calibration, identification, diagnostics, etc. Importantly, the devices conforming to at least some of these protocols are capable of detecting problems within the device itself and are capable of generating and sending alarm or alert messages to indicate the detected problems to the appropriate operators, maintenance personnel or engineering personnel responsible for the operation of the process control system.

Fieldbus devices communicate alarm or alert information using a well known message format. Fieldbus device alarm messages include a block identification field, a relative identification field, a subcode field and a floating point number field. Generally speaking, the fields provided within a Fieldbus device alarm message specify, in increasing levels of particularity, the source of an alarm message and the nature of the alarm or alert conveyed thereby. In particular, the block identification field within a Fieldbus device alarm message identifies the block within the Fieldbus device from which the alarm message originated. Thus, a controller, workstation, etc. may use the block identification field within a Fieldbus device alarm message to determine which block generated the alarm message and whether the alarm message was generated by a function block, resource block or a transducer block.

The relative identification field of a Fieldbus device alarm message identifies what parameter within a particular block (e.g., a function block, resource block, or transducer block) caused the generation of the alarm message. A given block may have two or more parameters associated with it that can be distinguished from each other by using different values within the relative identification field. For example, a function block may have several inputs and outputs, each of which may be uniquely associated with a different relative identification field value.

The subcode field generally provides a numeric value that is indicative of the nature of the alarm message being transmitted by a device and which is predetermined by the device manufacturer. For example, the subcode field may be used to indicate that a sensor reading is outside of a normal operating range, that a sensor has failed completely, or any other failure which can occur within a Fieldbus device.

In Fieldbus devices the subcode field is device and manufacturer specific so that different types of failures within a particular block of a given Fieldbus device may result in different subcode field values and so that identical types of failures within different devices and/or within similar devices made by different manufacturers may also result in different subcode field values being sent within an alarm message. Because the subcode field is not user configurable and because the subcode field values for particular types of failures are device and/or manufacturer specific, manufacturers typically provide a list of subcodes and corresponding failure types so that the subcode values may be translated by a user, operator, designer, etc. into failure types.

The floating point field typically contains a floating point number that is associated with the subcode being reported within the alarm message. Thus, in the case where a subcode field indicates that a sensor reading within a particular transducer block is outside of a normal operating range, the floating point field may contain a floating point value representing the actual out of range sensor reading.

As is commonly known, the blocks (i.e., the transducer, resource and function blocks) within Fieldbus devices are capable of providing an alarm notification or reporting parameter BLOCK_ALM and an alarm description or condition parameter BLOCK_ERR. Generally speaking, BLOCK_ALM enables a Fieldbus device to report via a controller and an operator workstation to a system user or operator that an alarm condition exists within that Fieldbus device. Whereas, BLOCK_ERR defines which ones of sixteen different possible alarm or alert conditions have been detected by the Fieldbus device that is reporting an active alarm condition via BLOCK_ALM. As is known, BLOCK_ERR includes sixteen bits, each of which represents one of sixteen predefined possible alarm or alert conditions that can occur in connection with a particular block of a particular Fieldbus device. The sixteen predefined alarm or alert conditions include a device needs maintenance soon condition, a device needs maintenance now condition, an input failure condition, an output failure condition, a memory failure condition, a lost static data condition, an other condition, etc. In addition to the sixteen predetermined detectable alert or alarm conditions, some Fieldbus device manufacturers provide Fieldbus devices that include diagnostics to detect other conditions. For example, a Fieldbus device may detect plugged valve lines or a valve drive failure, may provide a travel alarm, etc. and may report these other types of conditions by setting the "other" bit of the BLOCK_ERR parameter and reporting the other condition via the BLOCK_ALM parameter. Alternatively or additionally, some Fieldbus device manufacturers may report these other types of conditions (i.e., those conditions that are not one of the sixteen predefined conditions) using vendor specific alarms and/or parameters, which may vary widely between device manufacturers.

Unfortunately, the sixteen predefined Fieldbus alarm or alert conditions are grouped together under the BLOCK_ERR parameter and any one active condition (i.e., an alert or alarm condition that has been detected by the device) will cause the BLOCK_ALM parameter to report that the device has an active alarm or alert. Thus, if a first alarm or alert condition becomes active within a traditional Fieldbus device, the BLOCK_ALM parameter reports that first alarm or alert and any alarm or alert conditions that become active following that first alarm are not reported until the first reported alarm or alert is cleared or acknowledged. As a result, a relatively low priority alarm or alert condition may mask the reporting of a more serious condition until the system user or operator clears or acknowledges the low priority, first reported condition. By way of example, a block within a Fieldbus device may detect and report a "device needs maintenance soon" condition using the BLOCK_ERR and BLOCK_ALM parameters and if the device subsequently detects "a device needs maintenance now" condition, that subsequently detected condition may be reflected (i.e., by setting the appropriate bit) within the BLOCK_ERR parameter. However, BLOCK_ALM will not be able to report the more serious "device needs maintenance now" condition until the alarm or alert reported in connection with the "device needs maintenance soon" condition is cleared or acknowledged by the system user.

SUMMARY OF THE INVENTION

The enhanced Fieldbus device alerts described herein enable Fieldbus devices within a process control system to report alarm or alert conditions that are detected within the devices to a system user or operator using a plurality of independently reportable device alarm parameters, each of which corresponds to a different level of severity and each of which may require a different type of response by the system user or operator.

In accordance with one aspect of the invention, a method of generating a Fieldbus alert message within a process control system includes the steps of uniquely associating a plurality of device conditions for a Fieldbus device with a plurality of independently reportable alert parameters having different levels of severity and detecting a condition associated with the Fieldbus device. The method may also include the step of storing first information within a first parameter corresponding to one of the independently reportable alert parameters to indicate the existence of the detected condition and applying a mask parameter to the first parameter to generate a second parameter corresponding to the one of the independently reportable alert parameters. Additionally, the method may include the step of generating the Fieldbus alert message based on the second parameter.

In accordance with another aspect of the invention, a method of generating a Fieldbus alarm may include the steps of associating a plurality of device conditions for a Fieldbus device with a plurality of independently reportable alarms and detecting a condition associated with the Fieldbus device. The method may further include the steps of storing first information in a parameter corresponding to one of the plurality of independently reportable alarms in response to detecting the condition and generating the Fieldbus alarm based on the parameter corresponding to the one of the plurality of independently reportable alarms and one of the plurality of independently reportable alarms.

In accordance with yet another aspect of the invention, a smart field device for use in a process control system may include a processor and a memory coupled to the processor. The processor may be programmed to associate a plurality of device conditions for the smart field device with a plurality of independently reportable alarms and to detect a condition associated with the smart field device. The processor may be further programmed to store first information in a parameter corresponding to one of the plurality of independently reportable alarms in response to detecting the condition and to generate an alarm message based on the parameter corresponding to the one of the plurality of independently reportable alarms and one of the plurality of independently reportable alarms.

DESCRIPTION OF THE PREFERRED EMBODIMENTS

Figure 1:
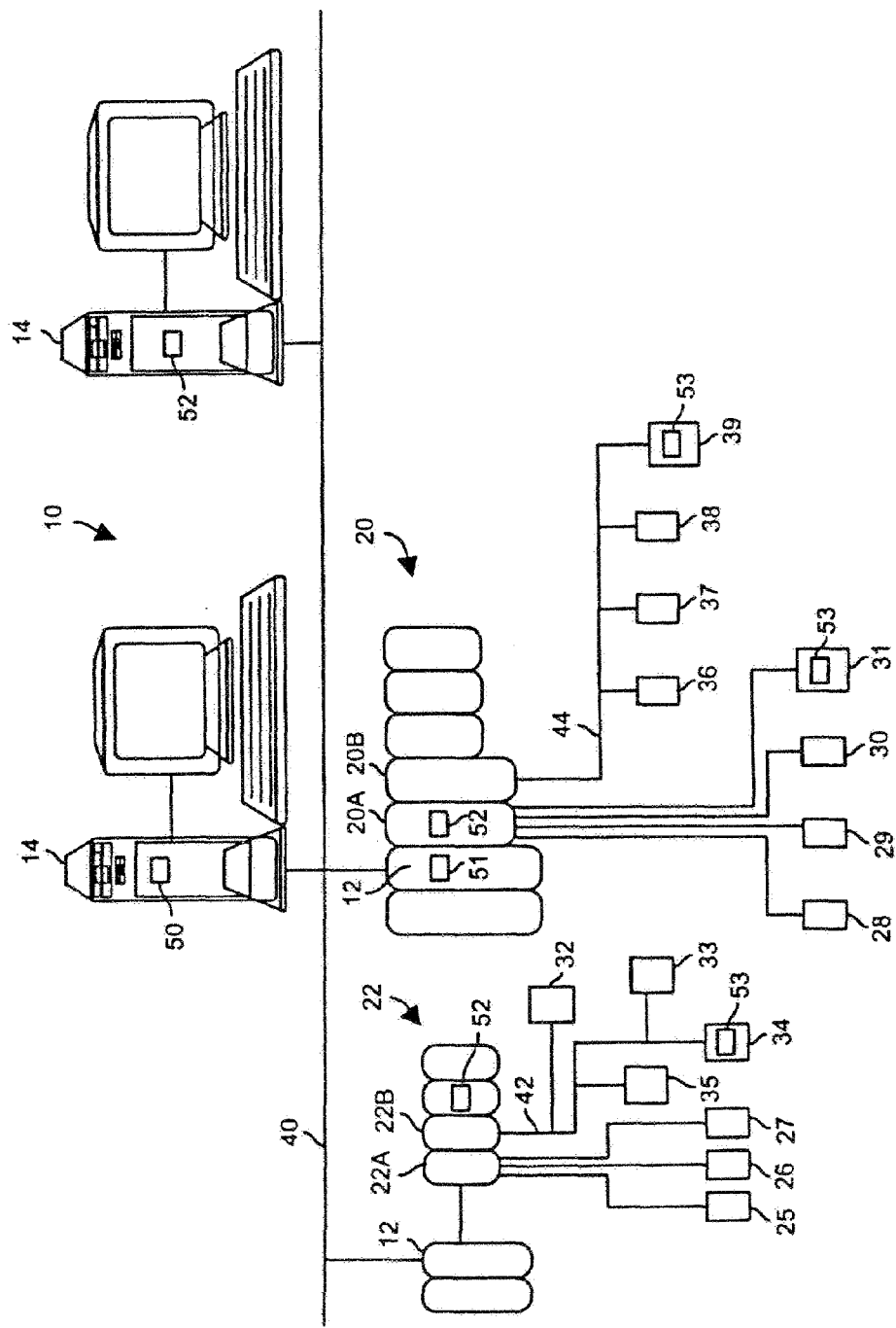
FIG. 1 is a block diagram of a process control system in which Fieldbus devices having enhanced alert or alarm capability may be used.

Referring now to FIG. 1, a process control network or system 10 includes one or more process controllers 12 connected to one or more host workstations or computers 14 (which may be any type of personal computer or workstation) and banks of input/output (I/O) devices 20, 22, each of which is connected to one or more field devices 25-39. The controllers 12 may be, for example, DeltaV™ controllers sold by Fisher-Rosemount Systems, Inc., and are communicatively connected to the host computers 14 via, for example, an Ethernet connection 40 or any other suitable communication link. Likewise, the controllers 12 are communicatively connected to the field devices 25-39 using any desired hardware and software associated with, for example, standard 4-20 mA devices and/or any smart communication protocol such as the Fieldbus or HART protocols. As is generally known, the controllers 12 implement or supervise process control routines stored therein or otherwise associated therewith and communicate with the field devices 25-39 to control a process in any desired manner.

The field devices 25-39 may be any types of devices, such as sensors, valves, transmitters, positioners, etc., while the I/O cards within the banks 20 and 22 may be any types of I/O devices conforming to any desired communication or controller protocol such as HART, Fieldbus, Profibus, etc. In the embodiment illustrated in FIG. 1, the field devices 25-27 are standard 4-20 mA devices that communicate over analog lines to the I/O card 22A, the field devices 28-31 are illustrated as HART devices connected to a HART compatible I/O device 20A, and the field devices 32-39 are Fieldbus field devices, that communicate over a digital bus 42 or 44 to the I/O cards 20B or 22B using Fieldbus protocol communications.

Each of the controllers 12 is configured to implement a control strategy using function, transducer and resource blocks. As is well known, each block is a part (e.g., a subroutine) of an overall control routine and operates in conjunction with other blocks (via communications called links) to implement process control loops within the process control system 10. Function blocks and transducer blocks typically perform input functions, such as those associated with a sensor or other process parameter measurement device, control functions, such as those associated with a control routine that performs PID control, fuzzy logic control, etc., or output functions that control the operation of some device, such as a valve, to perform some physical function within the process control system 10. Of course, hybrid and other types of blocks exist.

Function blocks may be stored in and executed by the controller 12, which is typically the case when function blocks are used for, or are associated with, standard 4-20 mA devices and some types of smart field devices, or may be stored in and implemented by the field devices themselves, which may be the case with the Fieldbus devices 32-39. While the description of the control system 10 is provided herein using a function, transducer and resource block control strategy, the control strategy could also be implemented using other techniques, such as ladder logic, sequential flow charts, etc. and using any desired proprietary or non-proprietary programming language.

Figure 3:
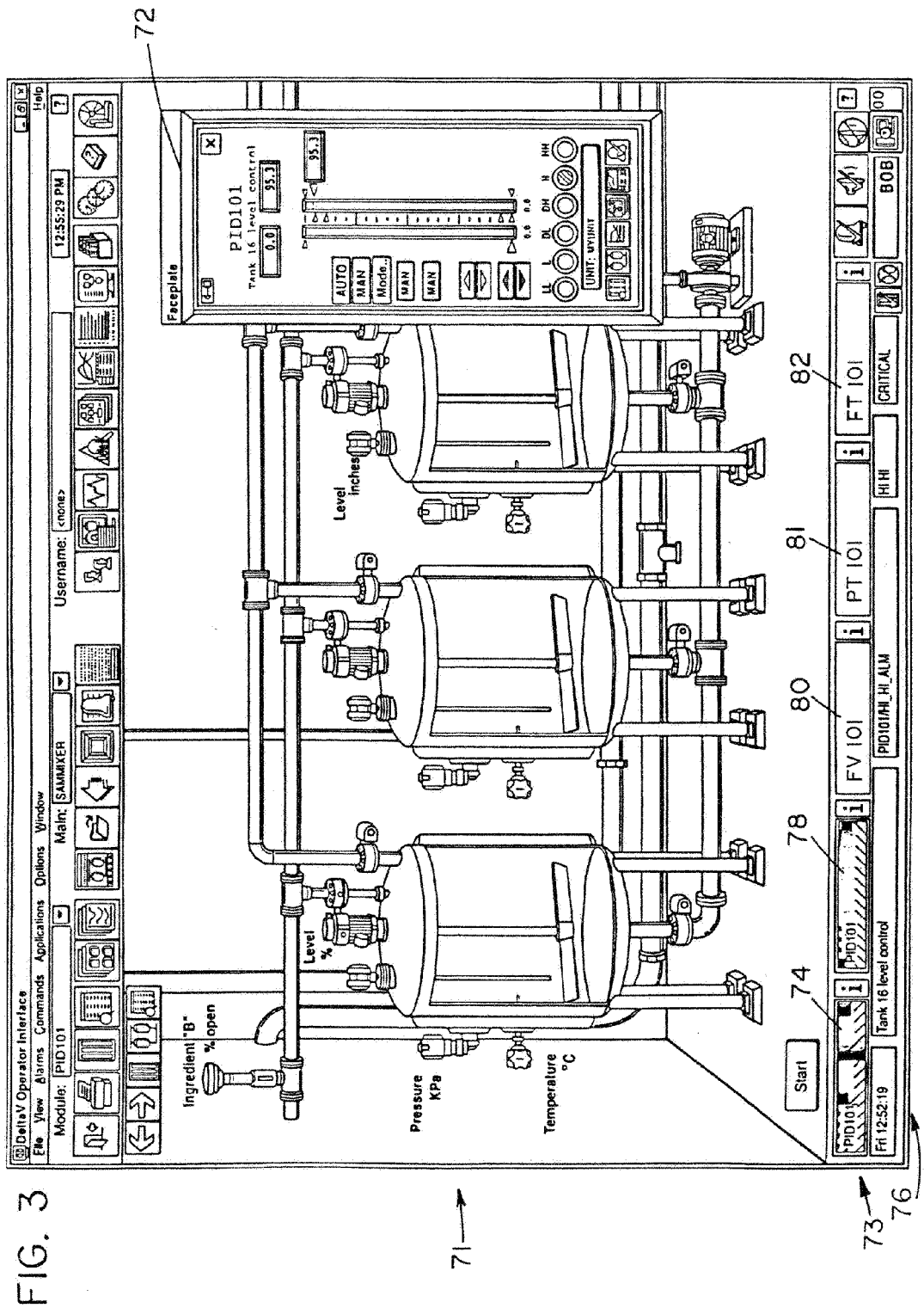
FIG. 3 is an exemplary user interface screen that may be generated by the alarm display and interface system used in the process control system of FIG. 1.

In the system of FIG. 1, one or more of the host devices 14 functions as an operator workstation and has alarm processing software 50 stored therein. Generally speaking, the alarm processing software 50 displays information about the process control system 10 pertinent to the system operator's or user's understanding or ability to view the current operational status of the process with respect to the alarms present in the system. For example, the alarm processing software 50 may display an alarm banner having alarm indications therein and a primary control display illustrating a section of the process control system 10, including the devices and other equipment associated with that section of the process control system 10 relevant to one or more of the alarms being displayed within the alarm banner. The primary control display may provide information about the current state of the process control system 10, such as the level of a fluid in a tank, the flow characteristic of a valve and other fluid lines, the settings of equipment, the readings of sensors, the status of a device, etc. An example of such a display is illustrated in FIG. 3. An operator may use the alarm processing software 50 to view different parts of the process control system 10 or equipment within the process control system 10. Of course, the alarm processing software 50 communicates with the controllers 12 and, if necessary, the field devices 25-39, any of the banks of I/O devices 20, 22 or any other devices to obtain the relevant values, settings and measurements associated with or being made in the process control system 10 to create the interface screen on the operator display of the workstation 14.

The alarm processing software 50 is configured to receive alarm messages created by alarm generating software within some or all of the controllers 12, the I/O devices 20 and 22 and/or the field devices 25-39. This software is generally illustrated as software elements 51, 52 and 53 in FIG. 1. Generally speaking, the alarm processing software 50 receives different categories of alarm messages including, for example, process alarms (which are typically generated by process control software modules, such as those made up of communicatively interconnected function blocks, forming process control routines used during runtime of the process), hardware alarms, such as alarms generated by the controllers 12, I/O devices 20 and 22 or other workstations 14, pertaining to the state or functioning condition of these devices, and device alarms, which are generated by some or all of the field devices 25-39 to indicate problems or potential problems associated with those devices. These or other categories of alarms may be generated in any desired manner. For example, it is well known to have the function blocks or software modules that are used to implement process control functions generate process alarms, and these process alarms are typically sent in the form of alarm messages to operator interfaces for display. Also, some smart devices, controllers, I/O devices, databases, servers, workstations, etc. may use any desired proprietary or non-proprietary software to detect problems, errors, maintenance alerts, etc. and may send alarms or alerts indicating these conditions to the operator interface 14. In particular, many devices, such as controllers, I/O devices and smart field devices are provided with software and/or sensors that detect hardware problems, such as a stuck valve plug, broken parts, maintenance concerns, etc. and may generate signals or messages indicting these conditions.

If desired, the alarm processing software 50 may receive and filter alarms based on a number of factors. In particular, the alarm processing software 50 may filter alarms based on the workstation in which the software 50 is executed, the identity of the person logged into the workstation, and operator configurable settings, such as category, type, priority, status, time of generation, etc. of the alarm. For example, the alarm processing software 50 may filter alarms to selectively display alarms from the areas or sections of the plants that the workstation executing the alarm processing software 50 is configured to receive. In other words, alarms for certain areas or sections of the plant may not be displayed at particular workstations but, instead, each workstation may be limited to displaying alarms for one or more specific areas of the plant. Likewise, alarms may be filtered based on operator identification so that individual operators may be limited to viewing certain categories, types, priority levels, etc. of alarms or may be limited to viewing alarms from a section or subsection (e.g., an area) of the plant. The alarm processing software 50 may also filter alarms for display based on the operator's security clearance. In general, these workstation and operator filtering settings are referred to herein as workstation and operator scope controls.

The alarm processing software 50 may also filter the viewable alarms (i.e., those within the workstation and operator scope controls) based on operator configurable settings including, for example, the alarm category (e.g., process, device or hardware alarm), alarm type (e.g., communication, failure, advisory, maintenance, etc.), the alarm priority, the module, device, hardware, node or area to which the alarm pertains, whether the alarm has been acknowledged or suppressed, whether the alarm is active, etc.

Some or all of the Fieldbus devices 32-39 may include three independently reportable device alarm or alert categories that have not previously been used in connection with Fieldbus devices. Generally speaking, each of these independently reportable alarm categories may correspond to a different level of severity and, thus, alarms or alerts within each category may require a different type of response by the system user or operator.

In particular, the Fieldbus devices 32-39 may provide an alarm parameter FAILED_ALM, which is generally indicative of a problem within a device that has ceased to operate properly or which may not be operating at all, thereby preventing the device from performing its normal sensing and/or control functions. For example, a memory failure within a device, a drive failure within a device, or any other device failure that may require immediate attention (i.e., maintenance, repair, etc.) may be reported using the FAILED_ALM parameter. The Fieldbus devices 32-39 may also provide an alarm parameter MAINT_ALM, which is generally indicative of a condition detected within a device that is associated with a requirement for some type of device maintenance, but which is not severe enough to merit reporting via the FAILED_ALM parameter. Device conditions reported using the MAINT_ALM parameter are preferably, but not necessarily, conditions that result from some type of degradation, wear, fatigue, etc. within a device that could ultimately result in failure of the device, but which do not necessarily affect the ability of the device to sense, to control or to perform any other needed function. For example, sticking valves, impulse lines that are becoming plugged, etc. are device conditions that may result in the reporting of an alarm or alert via the MAINT_ALM parameter. Additionally, the Fieldbus devices 32-39 may provide an alarm parameter ADVISE_ALM, which is generally indicative of a condition detected within a device that only merits an alert or alarm of an advisory nature. Generally speaking, alarms or alerts that are reported using the ADVISE_ALM parameter do not have any impact on the operation of the device or the process being controlled and/or monitored using the device. For example, a grounding problem detected by a magmeter, a transient over temperature or a transient over pressure detected by a sensor may be reported using the ADVISE_ALM parameter.

Thus, in contrast to the BLOCK_ALM and BLOCK_ERR parameters used by traditional Fieldbus devices, the independently reportable FAILED_ALM, MAINT_ALM and ADVISE_ALM parameters described herein enable a Fieldbus device to simultaneously report multiple alarms or alerts having different levels of severity. In other words, a single Fieldbus device can, using the independently reportable alarms described herein, report a grounding problem, which does not require any immediate attention, using the ADVISE_ALM and at the same time that Fieldbus device can report a more severe condition such as, for example, a sensor failure that requires immediate attention using the ADVISE_ALM parameter, regardless of whether the FAILED_ALM has been acknowledged or cleared by the system operator.

Preferably, but not necessarily, each of the FAILED_ALM, MAINT_ALM and ADVISE_ALM parameters described herein are formed using a thirty-two bit word based on any desirable data format or type such as, for example, DS-72 or DS-71, which are both well known IEEE standards and, thus, will not be described further herein. Each bit within each thirty-two bit word may be representative of a unique device condition to be reported using the alarm parameter corresponding to that thirty-two bit word. Thus, thirty-two device conditions at each of the three different levels of severity (i.e., FAILED_ALM, MAINT_ALM and ADVISE_ALM) for a total of ninety-six unique alarm or alert conditions may be reported by each Fieldbus device. If desired, one bit within each of the independently reportable alarms FAILED_ALM, MAINT_ALM and ADVISE_ALM may be used for "other" conditions that are not specifically defined, thereby enabling the devices to more flexibly provide for the detection of a variety of device conditions which may not be anticipated during the design of the device and/or which may be needed by a particular user.

While, in general, a lower severity alarm or alert may be reported using the ADVISE_ALM or MAINT_ALM parameters without affecting the ability of a Fieldbus device to simultaneously report a higher severity alarm using the FAILED_ALM parameter, multiple active conditions (i.e., multiple detected device conditions) within a particular alarm parameter may not result in multiple alarm events being sent to the operator workstation 14. For example, if one of the Fieldbus devices detects an over pressure condition and an over temperature condition, the bits corresponding to these conditions will be set within the ADVISE_ALM parameter for that device. However, the first detected condition will cause an alarm event to be generated and sent to the operator workstation 14, while any subsequently detected condition will cause another alarm event to be generated and sent to the workstation only after the alarm event associated with the earlier or first detected condition is cleared or acknowledged by the system operator or user. As a result, if the Fieldbus device detects the over pressure condition first, the subsequently detected over temperature condition will not generate an alarm event until the system user or operator clears or acknowledges the over pressure alarm or alert.

The FAILED_ALM, MAINT_ALM and ADVISE_ALM parameters may be independently reported to the system user or operator via one of the workstations 14 using the Fieldbus alarm message format described above (i.e., the message format including a block identification field, a subcode field, etc.). Further, each of the thirty-two possible conditions associated with each of the FAILED_ALM, MAINT_ALM and ADVISE_ALM parameters is preferably, but not necessarily, represented using a unique subcode when these alarms are sent to a system workstation using the Fieldbus alarm messaging format. Each Fieldbus device includes definitions of the subcodes associated with each of the possible conditions for each of the FAILED_ALM, MAINT_ALM and ADVISE_ALM parameters. Also, each Fieldbus device may define a unique textual message that is descriptive of the condition associated with each of the subcodes. Although each subcode preferably corresponds to a unique device condition and, thus, a unique textual message, it may be desirable in some situations to use a single textual message for more than one device condition.

The independently reportable device alarm parameters described herein may be filtered by each device to enable or to disable the reporting of an alarm or alert in response to one or more the possible device conditions (i.e., the ninety-six possible conditions). Each of the Fieldbus devices 32-39 that are capable of reporting alarms using the independently reportable FAILED_ALM, MAINT_ALM and ADVISE_ALM parameters described herein may further include an active alarm parameter and a mask parameter for each of the independently reportable alarm parameters. In particular, each of the Fieldbus devices 32-39 may include FAILED_ACTIVE and FAILED_MASK parameters, which correspond to the reportable FAILED_ALM parameter, MAINT_ACTIVE and MAINT_MASK parameters, which correspond to the reportable MAINT_ALM parameter, and ADVISE_ACTIVE and ADVISE_MASK parameters, which correspond to the reportable ADVISE_ALM parameter. The mask and active parameters are preferably, but not necessarily, implemented using an unsigned thirty-two bit data format or type. Of course, any other suitable data type or format may be used instead.

Each of the thirty-two bits in the mask and active parameters uniquely corresponds to a condition within its corresponding reportable alarm parameter (i.e., FAILED_ALM, MAINT_ALM and ADVISE_ALM). In general, the bits of the mask parameters of each device may be set or reset during configuration, for example, to enable or to disable the ability of a device to report alarms in response to the detection of conditions associated with the FAILED_ALM, MAINT_ALM and ADVISE_ALM parameters or alarms for that device. In this manner, a system user or operator may selectively enable or disable those conditions for which each device will generate a Fieldbus alert or alarm message. Of course, a system user or operator may enable or disable as many or few device conditions as desired.

In operation, when a Fieldbus device detects a condition, a bit corresponding to that detected condition may be set within an appropriate active parameter. For example, if a Fieldbus device detects a failed sensor, a bit corresponding to that condition within the FAILED_ACTIVE parameter for a transducer block within that device may be set or reset to indicate the sensor failure. Any additional device conditions that are detected (and which have not been acknowledged, canceled or cleared), or which are detected at any time, may also result in bits being set or reset within the active parameter to indicate the existence of those additional conditions. However, as discussed in greater detail below, conditions which are detected following a reported condition (i.e., one for which a Fieldbus alarm message has been sent to the system operator) that has not yet been acknowledged may not be reported until that reported condition has been acknowledged, canceled or otherwise cleared by the system user or operator. The Fieldbus device may then use the FAILED_MASK parameter for the transducer block to filter the device conditions associated with that block for which the user or system operator does not want to receive alarms or alerts. The system user or operator may, at the time of system configuration, define which bits are set or reset in the FAILED_MASK parameter to achieve the desired filtering. By way of example, a logical AND operation may be performed with the FAILED_MASK parameter and the FAILED_ACTIVE parameter to generate the FAILED_ALM parameter to have bits that have been set or reset to indicate the presence of device conditions that are currently active (i.e., have been detected) and which have not been masked by the mask parameter.

In general, each of the independently reportable alarm parameters FAILED_ALM, MAINT_ALM and ADVISE_ALM may report or cause a Fieldbus device to send Fieldbus alarm or alert messages to the system user or operator (for any detected conditions that are active and which are not masked) in the order in which the conditions are detected. In other words, detected conditions within a particular one of the independently reportable alarm parameters for a particular device may be reported to the system user or operator in the order in which the conditions were detected (i.e., on a first in first out basis). Of course, detected conditions may be reported to the system user or operator using some other prioritization or sequencing mechanism if desired. For example, non-masked detected conditions may be reported in reverse chronological order (i.e., on a last in first out basis), based on the type of the condition detected, etc. Additionally, a Fieldbus device may provide a clear alarm message when all the alarm messages associated with a particular alarm parameter are cleared. Furthermore, if a mask parameter for a particular alarm is changed while a condition associated with the alarm parameter is active, the device may clear the alarm and reevaluate the alarm based on any changes that have been made to the mask parameter.

Each of the Fieldbus devices 32-39 may also include priority parameters FAILED_PRI, MAINT_PRI, and ADVISE_PRI for each of its respective FAILED_ALM, MAINT_ALM and ADVISE_ALM parameters. These priority parameters may be implemented using unsigned eight bit values, which provides 256 possible priority levels, and may, for example, be assigned a default level or value of two. Setting the priority level of an alarm to zero disables the reporting of that alarm and setting the priority level to any value between 1 and 255 enables a user or system operator to control the manner in which the alarm processing software 50 manages alarms or alerts on a system-wide basis. In particular, the numerous possible priority levels may be used to determine which devices alarms or alerts take precedence over the alarms or alerts of other devices. In this manner, the system user or operator can predefine how the system manages and processes a potentially large number of active alarms.

Each of the Fieldbus devices 32-39 may also include a RECOMMENDED_ACTION parameter that may be mapped to textual information within the device description information, which is stored within the devices. The textual information referenced by the RECOMMENDED_ACTION parameter may be displayed to the system operator or user to assist in the correction, repair, etc. of a device that has generated an alarm. In the case where a reported alarm has multiple active conditions, the recommended action displayed to the system user or operator may be the most critical or highest priority condition.

Figure 2:
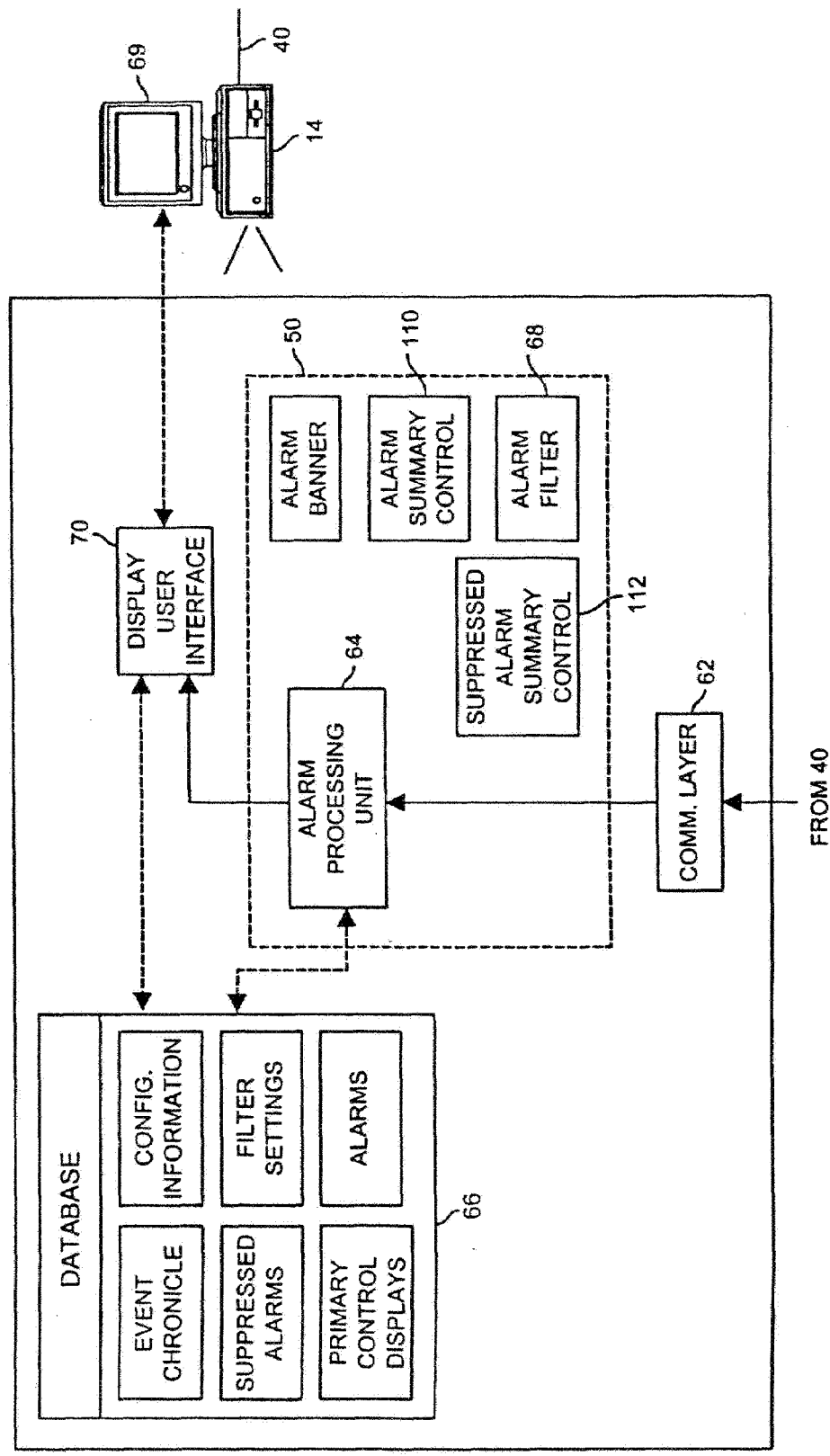
FIG. 2 is a block diagram of a workstation having an alarm display and interface system executed therein that may be used in the process control system shown in FIG. 1.

Referring now to FIG. 2, the configuration of one of the workstations 14 that implements the alarm display and interface system is illustrated in more detail. As illustrated in FIG. 2, the workstation 14 stores and executes communication software, such as a communication layer or stack 62, that communicates with the controllers 12 via the Ethernet connection 40 to receive signals sent by the controllers 12, I/O devices within the banks 20 and 22, the field devices 25-39 and/or other workstations. The communication layer 62 also properly formats messages to be sent to the controllers, I/O devices, the field devices 25-39 and other workstations such as alarm acknowledgment messages or signals, etc. The communication software used to implement the communication layer can be any known or desired communication software that is currently used with, for example, Ethernet communications. Of course, the communication stack 62 is coupled to other software that performs other functions, such as configuration applications, diagnostic or other process applications, database management applications, etc. executed within the workstation 14.

The alarm display and interface system includes an alarm processing unit 64 that receives alarms and other event information from the communication layer 62 in the form of messages, decodes those messages containing alarm or other event information and may store the alarm and other event information in a database 66. The front end of the alarm processing unit 64, which interfaces with the communication layer 62 and the database 66, may be an alarm receiver. The alarm processing software 50 also includes an alarm filter 68 that the alarm processing unit 64 uses to determine which alarms are to be displayed on a user interface 69 (such as a CRT, LCD, LED, plasma display, printer, etc.) associated with the workstation 14. The filter 68 may have its settings stored in the database 66 and these filter settings may be preconfigured and/or may be changed by a user based on the user's preferences. It should be recognized that the filter 68 and its settings are distinct from the device level mask parameters FAILED_MASK, MAINT_MASK and ADVISE_MASK. That is, a system user or operator may filter specific alarms generated by specific conditions within specific devices using the device mask parameters. Alternatively or additionally, as described herein, the system user or operator may filter types or categories of alarms, alarms associated with particular plants, areas, units, loops, etc. within the process control system using the filter 68.

Generally, the filter settings may control the category and priority of alarms and, if desired, may establish the order of the alarms to be displayed using a number of different criteria. The workstation and operator scope controls affect what a particular operator can see (e.g., which alarms can be displayed at a particular workstation) based on the operator identification and workstation to which the operator is logged on. In this case, an operations license may be assigned to each workstation and, without an operations license, the alarm information and all alarm list/summary displays may be empty. In other words, no active or suppressed alarms of any category (i.e., process, hardware or device) will be shown by the alarm processing unit 64. Still further, only alarms from a plant area in the current operator's scope (the operator is usually given at least one security key in the plant area) are eligible to appear in the alarm displays on that workstation. Also, only alarms from a plant area and unit which has not been turned off using the plant area or unit filtering display(s) (to be discussed below) are eligible to appear in the alarm display. In this manner, the filter 68 prevents the display of alarms outside of the workstation and operator scope and alarms from plant areas or units that have been turned off by the operator.

After testing alarms for conformance to the workstation and operator scope controls, the filter 68 filters out and determines the display order of alarms based on operator settings, which may include, for example, the category of alarm, the priority of the alarm, the type of alarm, the acknowledged status of the alarm, the suppressed status of the alarm, the time of the alarm, the active status of the alarm, etc. The received alarms, which are sent to the alarm processing software 50 using alarm messages (e.g., Fieldbus alarm messages) may include a parameter for each of these values and the filter 68 may filter alarms for display by comparing the appropriate parameters of the alarms to the filter settings. For example, the operator can indicate which categories of alarms and priority levels of alarm should be displayed on the screen. If desired, the operator can adjust a predetermined priority level for an alarm by offsetting the priority level from the preconfigured priority level for the alarm set by the manufacturer. In the DeltaV system, a priority level between about three and fifteen is selected for each alarm and the operator can offset this priority level by any number of levels to make a higher priority a lower priority or a lower priority a higher priority when viewed by the filter 68. While the operator may set the order of display of the alarms that are passed by the filter 68, the order may also be determined by preconfigured settings to provide a consistent display of different types of alarms.

In any event, the operator can customize the manner in which alarms are displayed based on the categories or types of alarms that the user is most interested in, which may all be one category or type of alarm such as process alarms, device alarms, hardware alarms or any combination of two or more categories of alarms. Further, the user may configure the display of alarms so that alarms or alerts of different severities may or may not be displayed. For example, the user may want to view only alarms or alerts contained within FAILED_ALM and MAINT_ALM parameters and may not want to view alarms or alerts contained within ADVISE_ALM parameters. The user may also have control over how the alarms are presented and the information provided with the alarms. In this manner, the alarm processing software 50 enables a single person to perform the operations of an operator, a technician or maintenance person and an engineer by viewing and addressing on the same screen the alarms that would normally be addressed by different personnel at different locations in a plant. Alternatively, at different times in the same system a maintenance person can use the same system to view only maintenance alarms while an engineer can view other types of alarms that are affecting the devices. In this manner, the alarm processing software 50 can be used by different types of people at the same time in different workstations to view different aspects of the alarms associated with the process control system 10. Furthermore, when using the alarm processing software 50, it is relatively easy for an individual to turn over alarm functions that they are viewing and acknowledging to another individual who may have the same software. Alternatively or additionally, an individual may set their filter to accept alarms that are normally viewed by another person. In this manner, one person may go to lunch and turn the alarm viewing function over to other persons at different workstations by resetting a few filter settings. When returning from lunch, that person may regain control of those functions. Also, when the amount of alarm information becomes too large for one person to handle, that person may hand off or shed the load for certain categories of alarms such as process alarms, device alarms or hardware alarms so that these alarms can be handled by other people at other terminals.

After the alarm processing unit 64 uses the filter 68 to decide which alarms (i.e., non-masked conditions) should be displayed to the user via the display 69 and the order in which the alarms should be displayed, the alarm processing unit 64 provides this information to a user display interface 70, which uses any standard or desired operating system to display alarm information on the alarm display 69 in any desired manner. Of course, the user display interface 70 obtains other information it needs, such as information about the layout of or the configuration of the process control system 10, the values of parameters or signals within that system, etc. from the database 66 or from other communication signals received from the process control system 10 via the communication layer 62. Also, the user display interface 70 receives commands from the user requesting, for example, more information related to particular alarms, changes to alarm or filter settings, new alarm displays, etc. and provides this information to the processing unit 64, which then takes the requested action, searches the database 66 for the alarm information, etc. to provide a new alarm view to the user via the display 69.

Generally speaking, there are different categories of alarms that can be generated and displayed on the display 69 including, for example, process alarms, device alarms and hardware alarms. Process alarms, which are known and which are typically generated by function blocks or modules within a process control routine running on a controller or a field device, have, in the past, been sent to and displayed on an operator interface. Process alarms generally indicate a problem with the functional operation of the process control software, i.e., a problem with the process control routine itself such as out-of-bounds measurement, abnormal variances between process parameters and set points, etc. Process alarms are typically configured by the user as components of process control modules and may appear in the configuration information provided on the operator interface as being associated with a module name. Some types of process alarms include bad input/output, out-of-bounds measurements, exceeded thresholds, etc. Because process alarms are well known in the art, they will not be described in more detail herein.

Device alarms such as the alarms associated with the FAILED_ALM, MAINT_ALM and ADVISE_ALM discussed above, are alarms associated with the operation of the field devices within the process and may be detected by software (e.g., the software 53 in FIG. 1) within the field devices or other devices connected within the process control system 10 to indicate a problem or error with the operation of a field device. Device alarms may appear in the operator interface of the system described herein as being associated with a particular device. Device alarms may, for example, indicate that the pressure in a valve is to great or to small for proper operation of the valve, that the motor current in the valve is to high or to low, that the voltage levels of a device are not synchronized, that a valve plug within a valve is stuck, that the device is not communicating properly, that the device needs scheduled maintenance because, for example, a certain amount of time has passed or because a valve member of the device has undergone a certain amount of travel since the last maintenance, etc. Device alarms can be generated in any desired manner, including with the use of proprietary or non-proprietary software located on a device itself or in other devices connected to the device for which the alarm is being generated to recognize and detect specific problems with the device and to generate an alarm with respect thereto.

As discussed above, there can be many different types of device alarms including, for example, failure alarms indicating that a failed or failing condition exists within a device, maintenance alarms indicating that maintenance of some type should take place, communication alarms indicating that a device is not communicating properly or at all, advisory alarms, etc. A failure (e.g., a "failed") alarm indicates that a device has detected one or more conditions indicating that it cannot perform a critical function and, thus, requires maintenance immediately. Whenever the failed alarm condition is true, the integrity of the device is considered bad, which rolls up to the controller and causes the integrity of the controller node to which the device is connected to be bad. On the other hand, a maintenance alarm indicates that a device is able to perform critical functions but has one or more detected conditions that may lead to a failure if left unaddressed and, thus, the device should receive maintenance attention soon. A communication (e.g., a "not communicating") alarm becomes active when a device stops communicating. Whenever the not communicating alarm condition is true, the integrity of the device is considered bad, which causes the integrity of the controller node to which the device is connected to be bad. An advisory alarm indicates that a device has detected conditions that do not fall into the other alarm categories. Usually, an advisory alarm is an alarm provided by individual devices and is uniquely associated with the type of device, such as a flow meter tracking the variability of the flow signal. In this case, the device may recognize that a variability in some signal associated with the device is too high or too low, which means that something unusual has happened and requires investigation. Depending on the device, advisory alarms may require more or less urgent attention than maintenance alarms and, thus, users may set the priority of the advisory alarm lower than that of the maintenance alarm. Of course, failed, maintenance and advisory alarms may not be supported by every device and a single, catch all alarm, such as an "abnormal" alarm for generic devices may be used instead of the failed, maintenance, and advisory alarms resulting in two total alarms, i.e., not communicating and abnormal. Of course, other types of device alarms could be created or used instead of or in addition to the ones discussed above.

In one embodiment, integrated alarm information may be provided to a user on a display in the form of an alarm banner at, for example, an edge of a display screen. Referring now to FIG. 3, an alarm banner 73 is located on the bottom of a screen 71. The alarm banner 73 includes a first line that displays indications of various alarms that have been generated by the process control system 10 and that have passed through the filter 68 to the display 69. At least one of the alarms indicated in the alarm banner 73 may be associated with the portion of the process control system 10 depicted in the main part of the screen 71. The specific alarms displayed in the alarm banner 73 and the order of these alarms are determined according to the configuration of the mask and priority parameters and the filter settings of the filter 68. Generally speaking, the highest priority alarms that have not been acknowledged, suppressed or masked will be displayed first, with the next highest priority arms being displayed next, and so on. In the exemplary screen of FIG. 3, the highest priority alarm 74 is a process alarm illustrated as being associated with a PID101 control routine. The alarm 74 is displayed in red to illustrate that its priority is critical. On the second line of the alarm banner 73, an alarm information field 76 displays alarm information associated with the alarm in the alarm banner 73 that is currently selected. In the example of FIG. 3, wherein the alarm 74 is selected, the alarm information field 76 illustrates that the alarm 74 was generated on Friday at 12:52:19, is associated with the "tank 16 level control," has a designation or name of PID101/HI_HI_ALM, has a high, high priority and is a critical alarm. If the alarm 74 is flashing, this means that the alarm is not acknowledged, while a constant (non-flashing) alarm indication in the alarm banner 73 means that the alarm has been acknowledged by some operator or user. Of course, other types of alarm information could be displayed within the alarm information field 76.

Also, the other alarm indications in the alarm banner 73, such as the alarm indication 78, may be yellow, purple, or any other color to indicate other levels of seriousness or priority associated with the alarm. When another alarm is selected, such as the alarm 78, 80, 81 or 82, alarm information pertaining to that alarm may be displayed in the alarm information field 76. When viewing an alarm in the alarm banner 73, the user can acknowledge the alarms and alert maintenance or engineer personnel to take the appropriate actions to correct the condition that led to the alarm or, alternatively, could take other steps such as resetting certain set points to alleviate the alarm condition.

As indicated above, by selecting one of the alarms in the alarm banner 73 such as the alarm 74, a primary control display for that alarm is presented in the screen 71. In particular, as shown in FIG. 3, the main body of the screen 71 includes a primary control display or depiction of pertinent hardware associated with a particular alarm (a selected alarm) within the process control system 10. In the example of FIG. 3, the hardware includes three tanks with various sensors attached thereto, all of which are interconnected by various valves and fluid flow lines. This hardware depiction is a representation of the equipment within a portion of the process control system 10 and provides information about the operation of some of the equipment, such as values or parameters associated with the tanks, sensors etc. Of course, some of this information may be provided by configuration information in the database 66 and signals from the sensors in the process control system via the controllers 12 and Ethernet connection 40. In this case, such information is sent through the communication layer 62 and is provided to the user display interface 70 via any known or desired software.

Figure 4:
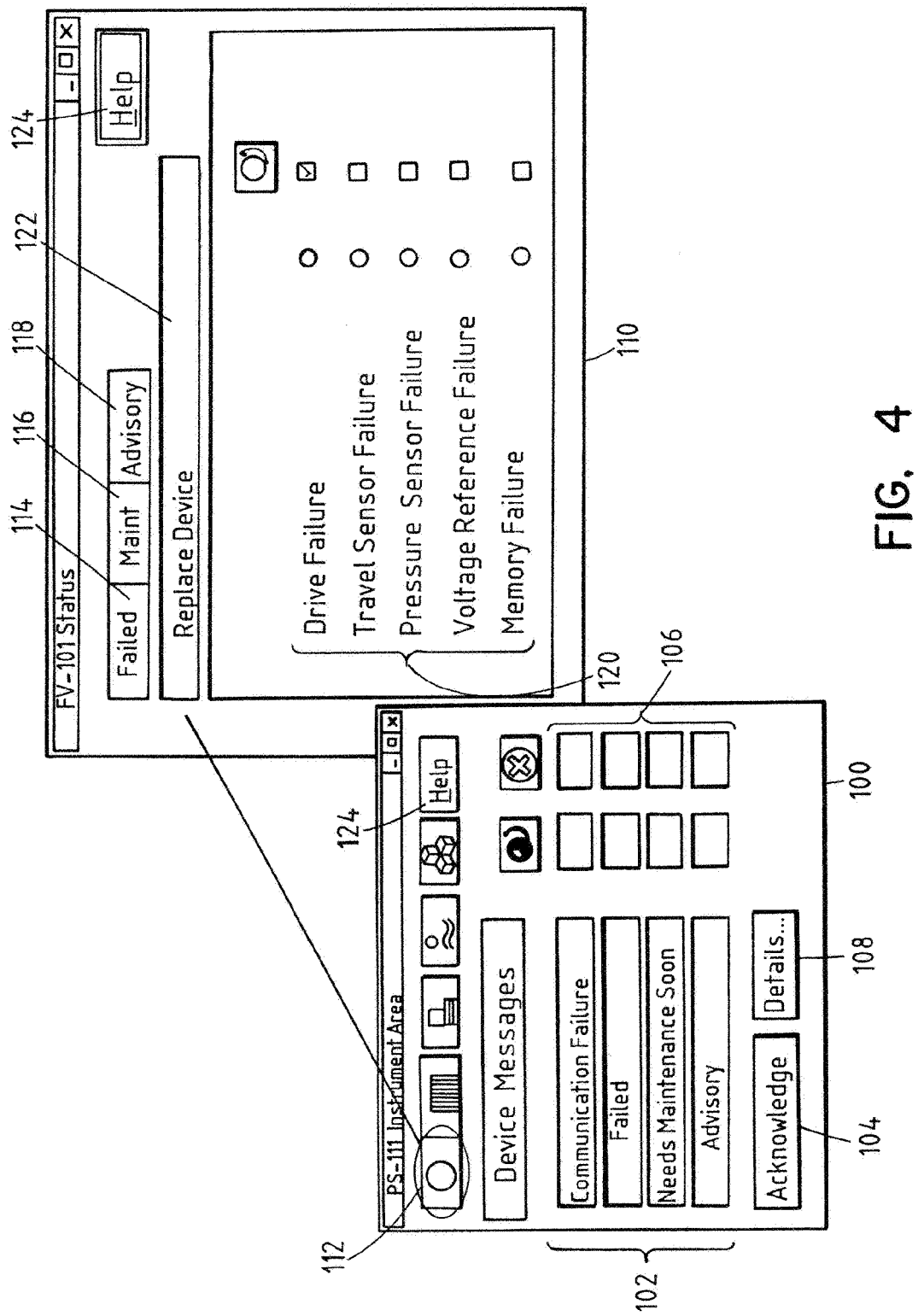
FIG. 4 is another exemplary user interface screen that may be generated by the alarm display and interface system used in the process control system of FIG. 1.
Figure 5:
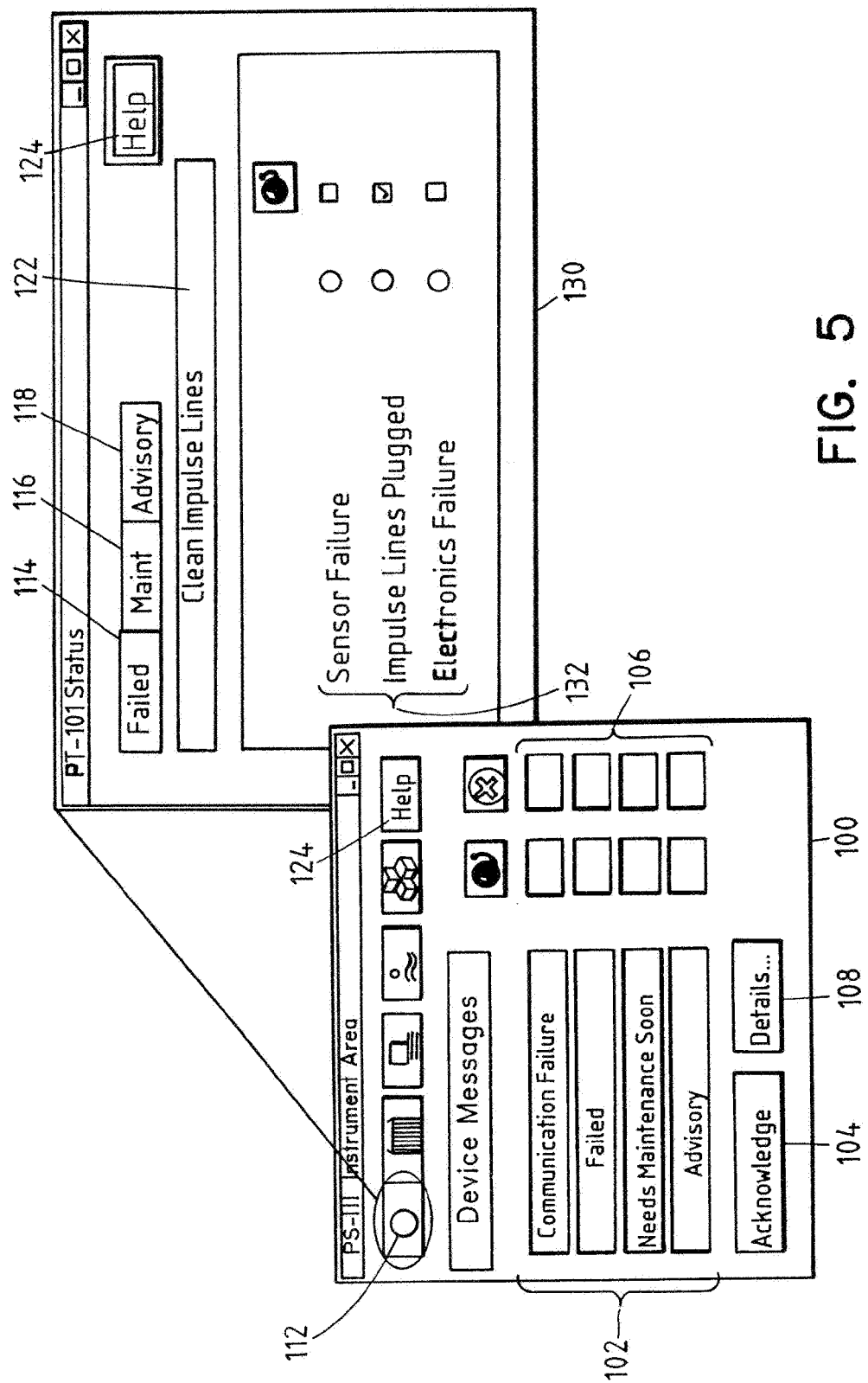
FIG. 5 is yet another exemplary user interface screen that may be generated by the alarm display and interface system used in the process control system of FIG. 1.
Figure 6:
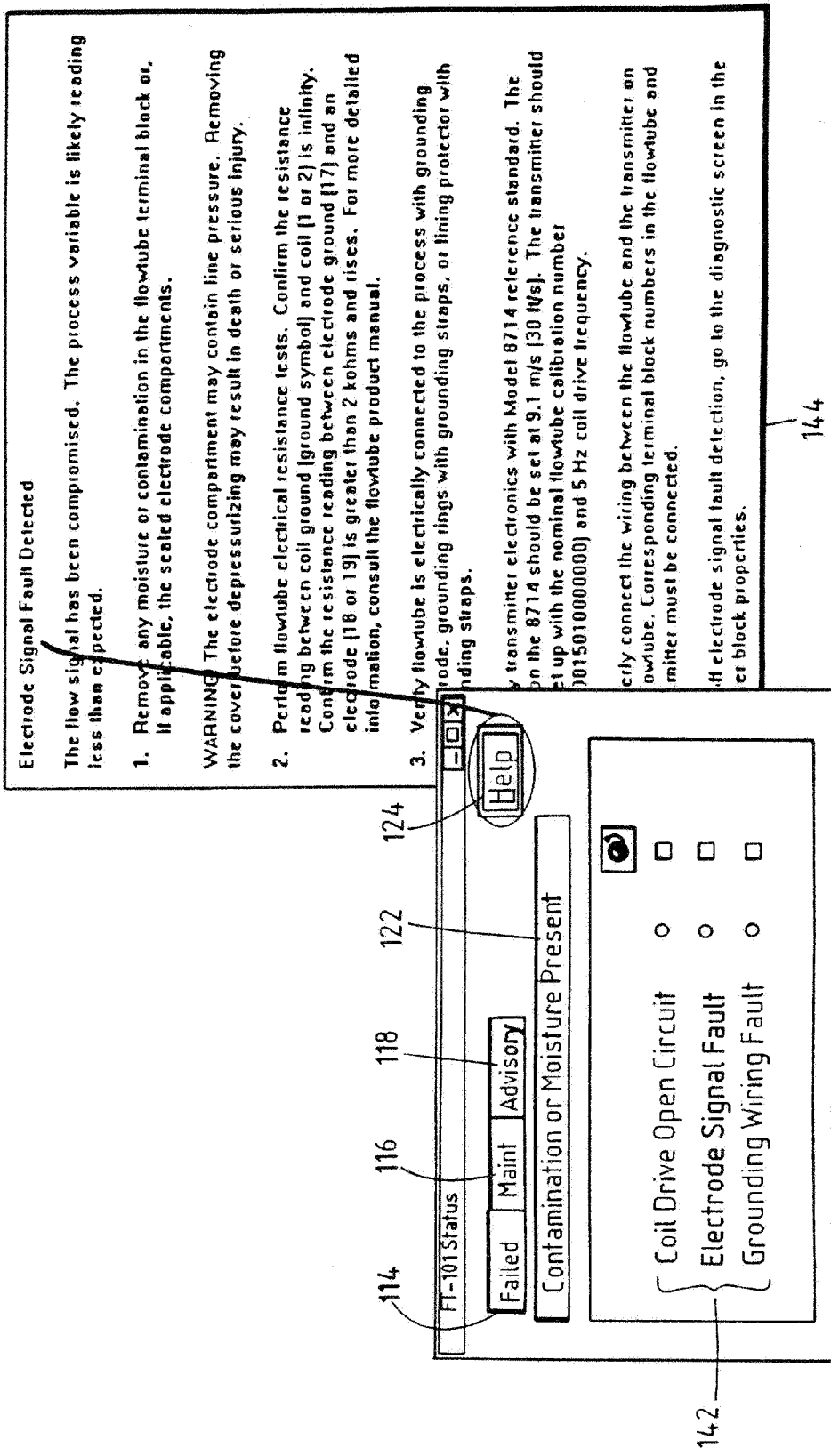
FIG. 6 is still another exemplary user interface screen that may be generated by the alarm display and interface system used in the process control system of FIG. 1.

FIGS. 4-6 are exemplary depictions of graphical displays that may be provided for use by a system user or operator via the alarm display and interface software 50. FIG. 4 depicts an exemplary pop up window 100 that may be displayed by the alarm processing software 50 in response to the system user or operator selecting one of the alarms from the alarm banner 73 shown in FIG. 3. In particular, if the user selects (e.g., by double clicking on) the alarm 80 associated with a flow valve FV 101, the pop up window 100 may be displayed. As shown in FIG. 4, the pop up window 100 includes alarm or alert bars 102, one or more of which may be highlighted to indicate an active condition within one or more of the independently reportable alarm parameters (i.e., FAILED_ALM, MAINT_ALM and ADVISE_ALM) for a device, which in this example is the flow valve FV 101. Of course, the "Failed" alarm bar may be highlighted as a result of an active condition within the FAILED_ALM parameter, the "Needs Maintenance Soon" bar may be highlighted as a result of an active condition within the "MAINT_ALM" parameter and the "Advisory" bar may be highlighted as a result of an active condition within the "ADVISE_ALM." Additionally, as shown in FIG. 4, the alarm or alert bars 102 may include a "Communication Failure" bar to indicate the presence of a communication failure.

The system user or operator may select an acknowledge button 104 to acknowledge a highlighted alarm or alert within the window 100 or, alternatively, may select one of the cancel boxes 106 to cancel one or more active alarms or alerts. Further, if desired, the user or system operator may select a "Details" button 108 to invoke other pop up windows, as discussed in greater detail below, that provide additional information related to those alarms that are currently active within the window 100.

FIG. 4 also depicts another pop up window 110 including more detailed status information associated with the flow valve FV 101. The status window 110 may be invoked from the window 100 by selecting an icon 112, the details button 108, a highlighted one of the alarm or alert bars 106, or in any other desired manner. In any event, the status window 110 may include bars 114, 116 and 118, each of which corresponds to one of the independently reportable alarms or alerts. In this example, the "Failed" bar is highlighted because the flow valve FV 101 currently has an unacknowledged active condition within a FAILED_ALM parameter of the valve FV 101. The status window 110 also includes a list of possible conditions 120 associated with the reporting of a failure within the flow valve FV 101. It is important to recognize that while only five conditions are shown in this example more or fewer than five conditions may be provided if desired. Each of the possible conditions 120 shown within window 110 corresponds uniquely to the unmasked active conditions that may be reported by the FAILED_ALM parameter for that device. Still further, the window 110 provides a recommended action bar 122, which displays the textual information that is associated with the RECOMMENDED_ACTION parameter of the device and which may be stored within the device description of the device. Additionally, the window 110 includes a help button 124 which, if selected by the system user or operator, may invoke another pop up window (such as the help window 144 shown in FIG. 6 and discussed below) containing textual information for facilitating the user or system operator in troubleshooting, repairing, etc. the device that generated the alarm or alert currently being viewed.

FIG. 5 is another exemplary depiction of a pop up window 130 that provides status information associated with a pressure transmitter PT 101. The general format of the window 130 shown in FIG. 5 is identical to that shown FIG. 4 except that the window 130 includes possible conditions 132, which are conditions that may cause the pressure transmitter PT 101 to generate a maintenance alert or alarm. It should be noted that, in this example, the maintenance button 116 is highlighted or active, which indicates that a non-masked condition associated with the MAINT_ALM parameter for the pressure transmitter PT 101 is currently active and unacknowledged.

FIG. 6 is yet another exemplary depiction of a pop up window 140 that provides status information associated with a flow transmitter FT 101 and which includes a group of possible conditions 142 that are similar or identical to the conditions that may be reported by the MAINT_ALM parameters for the flow transmitter FT 101. FIG. 6 also shows the pop up help window 144 that may be invoked by selecting the help button 124. As shown in FIG. 6, the help window 144 includes detailed textual information, which may be provided by the device description of the flow transmitter FT 101 and sent to the workstation 14 for display via the alarm display software 50.

While the alarm display and interface software 50 has been described as being used in conjunction with Fieldbus and standard 4-20 mA devices, it can be implemented using any other external process control communication protocol and may be used with any other types of controller software. Although the alarm display and interface software 50 described herein is preferably implemented as software, it may be implemented in hardware, firmware, etc., and may be implemented by any other processor associated with the process control system 10. Thus, the routine 50 described herein may be implemented in a standard multi-purpose processor or using specifically designed hardware or firmware as desired. When implemented in software, the software routine may be stored in any computer readable memory such as on a magnetic disk, a laser disk, or other storage medium, in a RAM or ROM of a computer or processor, etc. Likewise, this software may be delivered to a user or a process control system via any known or desired delivery method including, for example, on a computer readable disk or other transportable computer storage mechanism or over a communication channel such as a telephone line, the Internet, etc. (which are viewed as being the same as or interchangeable with providing such software via a transportable storage medium).

Of course, while the independently reportable alarms described herein have been described as having three levels of severity or types of alarm (i.e., FAILED_ALM, MAINT_ALM, and ADVISE_ALM), it should be recognized that two levels or more than three levels of severity may be used instead without departing from the scope and the spirit of the invention.

Thus, while the present invention has been described with reference to specific examples, which are intended to be illustrative only and not to be limiting of the invention, it will be apparent to those of ordinary skill in the art that changes, additions or deletions may be made to the disclosed embodiments without departing from the spirit and scope of the invention.

What is claimed is:

1. A method of generating a Fieldbus alert message within a process control system, comprising the steps of:
    uniquely associating a plurality of device conditions for a Fieldbus device with a plurality of independently reportable alert parameters having different levels of severity;
    detecting a condition associated with the Fieldbus device;
    storing first information within a first parameter corresponding to one of the independently reportable alert parameters to indicate the existence of the detected condition;
    applying a mask parameter to the first parameter to generate a second parameter corresponding to the one of the independently reportable alert parameters, the mask parameter indicative of device conditions, in a subset of device conditions for the Fieldbus device, that can be reported, the subset corresponding to device conditions associated with the one independently reportable alert parameter; and
    generating the Fieldbus alert message based on the second parameter.

2. The method of claim 1, wherein the act of uniquely associating the plurality of device conditions for the Fieldbus device with the plurality of independently reportable alert parameters includes the act of uniquely associating the plurality of device conditions for the Fieldbus device with an alert parameter associated with a failure of the Fieldbus device, an alert parameter associated with maintenance of the Fieldbus device and an alert parameter associated with advisory information relating to the Fieldbus device.

3. The method of claim 1, wherein the act of detecting the condition associated with the Fieldbus device includes the act of detecting one of a condition associated with a failure of the Fieldbus device, a condition associated with maintenance of the Fieldbus device and a condition associated with an advisable action relating to the Fieldbus device.

4. The method of claim 1, wherein the act of storing the first information within the first parameter corresponding to the one of the independently reportable alert parameters to indicate the existence of the detected condition includes the act of setting a bit within the first parameter that uniquely corresponds to the detected condition.

5. The method of claim 1, wherein the act of applying the mask parameter to the first parameter to generate the second parameter includes the act of performing a logical AND operation with the mask parameter and the first parameter.

6. The method of claim 1, wherein the act of generating the Fieldbus alert message based on the second parameter includes the act of generating the Fieldbus alert message to include a subcode uniquely associated with the detected condition.

7. The method of claim 1, further comprising the act of storing information within a third parameter associated with a recommended action for responding to the detected condition.

8. The method of claim 7, wherein the act of storing the second information within the third parameter includes the act of storing information associated with textual information stored within the Fieldbus device.

9. The method of claim 1, further comprising the act of configuring a plurality of priority parameters to define a priority for each of the independently reportable alert parameters.

10. A method of generating a Fieldbus alarm, comprising the acts of:
    associating a plurality of device conditions for a Fieldbus device with a plurality of independently reportable alarms;
    detecting a condition associated with the Fieldbus device;
    storing first information in a parameter corresponding to one of the plurality of independently reportable alarms in response to detecting the condition;
    generating, at the Fieldbus device, a Fieldbus alert message that reports the detected condition and the one independently reportable alarm based on the parameter;
    transmitting the Fieldbus alert message over a bus that operates according to a Fieldbus communication protocol; and the method further comprising the act of applying a mask parameter to the parameter corresponding to the one of the plurality of independently reportable alarms prior to generating the Fieldbus alert message.

11. The method of claim 10, wherein the act of associating the plurality of device conditions for the Fieldbus device with the plurality of independently reportable alarms includes the act of associating the plurality of device conditions for the Fieldbus device with a failure of the Fieldbus device, maintenance needed by the Fieldbus device and advisory information relating to the Fieldbus device.

12. The method of claim 10, wherein the act of detecting the condition associated with the Fieldbus device includes the act of detecting one of a condition associated with a failure of the Fieldbus device, a condition associated with maintenance of the Fieldbus device and a condition associated with an advisable action relating to the Fieldbus device.

13. The method of claim 10, wherein the act of storing the first information within the parameter corresponding to the one of the plurality of independently reportable alarms in response to detecting the condition includes the act of setting a bit within the parameter corresponding to the one of the plurality of independently reportable alarms that uniquely corresponds to the detected condition.

14. The method of claim 10, wherein the act of generating the Fieldbus alert message includes the act of generating the Fieldbus alert message to include a subcode uniquely associated with the detected condition.

15. The method of claim 10, further comprising the act of storing second information within a parameter associated with a recommended action for responding to the detected condition.

16. The method of claim 15, wherein the act of storing the second information within the parameter associated with the recommended action for responding to the detected condition includes the act of storing information associated with textual information stored within the Fieldbus device.

17. The method of claim 10, further comprising the act of configuring a plurality of priority parameters to define a priority for each of the independently reportable alarms.

18. A smart field device for use in a process control system, the smart field comprising:
a processor and a memory coupled to the processor, wherein the processor is programmed to associate a plurality of device conditions for the smart field device with a corresponding one independently reportable alarm of a plurality of independently reportable alarms and to detect a condition associated with the smart field device, and wherein the processor is further programmed to store first information in a parameter corresponding to one of the plurality of independently reportable alarms in response to detecting the condition, to generate an alarm message that reports the detected condition and the one independently reportable alarm associated with the detected condition, to transmit the alarm message over a bus; and
wherein the processor is further programmed to apply a mask parameter to the parameter corresponding to one of the plurality of independently reportable alarms prior to generating the alarm message.

19. The smart field device of claim 18, wherein the alarm message is a Fieldbus alarm message.

20. The smart field device of claim 18, wherein the processor is further programmed to associate the plurality of device conditions for the smart field device with a failure of the smart field device, maintenance needed by the smart field device and advisory information relating to the smart field device.

21. The smart field device of claim 18, wherein the processor is further programmed to detect one of a condition associated with a failure of the smart field device, a condition associated with maintenance of the smart field device and a condition associated with an advisable action relating to the field device.

22. The smart field device of claim 18, wherein the processor is further programmed to store the first information within the parameter corresponding to the one of the plurality of independently reportable alarms in response to detecting the condition by setting a bit within the parameter corresponding to the one of the plurality of independently reportable alarms that uniquely corresponds to the detected condition.

23. The smart field device of claim 18, wherein the processor is further programmed to generate the alarm message to include a subcode uniquely associated with the detected condition.

24. The smart field device of claim 18, wherein the processor is further programmed to store second information within a parameter associated with a recommended action for responding to the detected condition.

25. The smart field device of claim 24, wherein the second information includes information associated with textual information stored within the smart field device.

26. The smart field device of claim 18, wherein the processor is further programmed to configure a plurality of priority parameters to define a priority for each of the independently reportable alarms.

\* \* \* \* \*

UNITED STATES PATENT AND TRADEMARK OFFICE
CERTIFICATE OF CORRECTION

PATENT NO. : 7,562,135 B2  Page 1 of 1
APPLICATION NO. : 09/861790
DATED : July 14, 2009
INVENTOR(S) : Evren Eryurek et al.

It is certified that error appears in the above-identified patent and that said Letters Patent is hereby corrected as shown below:

At Column 17, line 55, "steps" should be -- acts --.

Signed and Sealed this

Ninth Day of March, 2010

David J. Kappos
*Director of the United States Patent and Trademark Office*